(12) United States Patent
Chi

(10) Patent No.: US 8,772,102 B2
(45) Date of Patent: Jul. 8, 2014

(54) METHODS OF FORMING SELF-ALIGNED CONTACTS FOR A SEMICONDUCTOR DEVICE FORMED USING REPLACEMENT GATE TECHNIQUES

(75) Inventor: Min-Hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/455,616

(22) Filed: Apr. 25, 2012

(65) Prior Publication Data

US 2013/0288468 A1   Oct. 31, 2013

(51) Int. Cl.
*H01L 21/265* (2006.01)
(52) U.S. Cl.
USPC ............................ 438/229; 438/525; 438/533
(58) Field of Classification Search
USPC ................. 438/299, 229, 230, 514, 525, 533; 257/E21.085
See application file for complete search history.

(56) References Cited

U.S. PATENT DOCUMENTS

| | | | |
|---|---|---|---|
| 5,935,873 A | 8/1999 | Spuler et al. | |
| 6,136,700 A * | 10/2000 | McAnally et al. | 438/666 |
| 6,342,449 B2 * | 1/2002 | Miyakawa | 438/692 |
| 7,501,355 B2 | 3/2009 | Bhatia et al. | |
| 7,932,166 B2 | 4/2011 | Frohberg et al. | |
| 8,048,790 B2 | 11/2011 | Soss et al. | |
| 2004/0164336 A1 | 8/2004 | Weimer et al. | |
| 2005/0101073 A1 * | 5/2005 | Bae et al. | 438/164 |
| 2008/0026517 A1 | 1/2008 | Grudowski et al. | |
| 2009/0321837 A1 | 12/2009 | Wei et al. | |
| 2010/0006932 A1 * | 1/2010 | Matsubara | 257/334 |
| 2010/0112798 A1 | 5/2010 | Lai et al. | |
| 2010/0233864 A1 | 9/2010 | Lee et al. | |
| 2011/0147853 A1 * | 6/2011 | Lin et al. | 257/379 |
| 2012/0052667 A1 * | 3/2012 | Kim et al. | 438/586 |
| 2012/0086048 A1 * | 4/2012 | Park et al. | 257/192 |
| 2012/0126295 A1 * | 5/2012 | Edge et al. | 257/288 |
| 2012/0139061 A1 * | 6/2012 | Ramachandran et al. | 257/410 |
| 2012/0309158 A1 * | 12/2012 | Hung et al. | 438/301 |
| 2012/0319214 A1 * | 12/2012 | Ma et al. | 257/410 |
| 2013/0122673 A1 | 5/2013 | Wang et al. | |

OTHER PUBLICATIONS

Hayashi et al., "Mechanism of Highly Selective SiO2 to Si3N4 Etching Using C4F8 + CO Magnetron Plasma." Jpn. J. Appl. Phys. vol. 38 (1999): pp. 4910-4916.*

(Continued)

*Primary Examiner* — Michele Fan
(74) *Attorney, Agent, or Firm* — Amerson Law Firm, PLLC

(57) ABSTRACT

One illustrative method disclosed herein involves forming an etch stop layer above a plurality of sacrificial gate structures, performing an angled ion implant process to implant an etch-inhibiting species into less than an entirety of the etch stop layer, and forming a layer of insulating material above the etch stop layer. The method further includes removing the sacrificial gate structures, forming replacement gate structures, forming a hard mask layer above the replacement gate structures and layer of insulating material, forming a patterned hard mask layer, performing another etching process through the patterned hard mask layer to define an opening in the layer of insulating material to expose a portion of the etch stop layer, performing another etching process on the exposed portion to define a contact opening therethrough that exposes a doped region and forming a conductive contact in the opening that is conductively coupled to the doped region.

42 Claims, 12 Drawing Sheets

(56) References Cited

OTHER PUBLICATIONS

Kim et al., "Plasma enhanced chemical vapor deposition Si-rich silicon oxynitride films for advanced self-aligned contact etching in sub-0.25 um ultralarge scale integration technology and beyond," J. Vac. Sci. Technolol. A, 18:1401-1410, Jul./Aug. 2000.

Kim et al., "Study on self-aligned contact oxide etching using C5F8/O2/Ar and C5F8/O2/Ar/CH2F2 plasma," J. Vac. Sci. Technol. A, 23:953-958, Jul./Aug. 2005.

Li et al., "Control of Source and Drain Extension Phosphorous Profile by Using Carbon Co-Implant," 15th IEEE International Conference on Advanced Thermal Processing of Semiconductors, RTP 2007.

Liu et al., "Contact Size Dependence of Highly Selective Self-Aligned Contact Etching with Polymer Formation and its Mechanism," 2000 IEEE/SEMI Advanced Semiconductor Manufacturing Conference, pp. 153-156.

Pawlak et al., "Performance and leakage optimization in carbon and fluorine co-implanted pMOSFETs," 2008 IEEE.

Sun et al., "An Atomic Level Study of Multiple Co-Implantation Technology for 32nm and Beyond pMOSFETs Ultra-Shallow Junction," 2011 IEEE.

Wang et al., "Enhanced Self Aligned Contact (SAC) Etch Stop Window by Using C4F6 Chemistry," 2001 IEEE/SEMI Advanced Semiconductor Manufacturing Conference, pp. 101-105.

Yu et al., "Highly Selective Contact Oxide Etching to Al2O3 Layer for Self-Aligned Contact (SAC) using CF4Cl2 Helicon Plasma," Hyundai Electronics Industries Co., Ltd, Memory R&D Division.

* cited by examiner

METHODS OF FORMING SELF-ALIGNED CONTACTS FOR A SEMICONDUCTOR DEVICE FORMED USING REPLACEMENT GATE TECHNIQUES

BACKGROUND OF THE INVENTION

1. Field of the Invention

Generally, the present disclosure relates to the manufacture of sophisticated semiconductor devices, and, more specifically, to various methods of forming self-aligned contacts (SAC) for semiconductor devices such as transistors that are formed using replacement gate techniques.

2. Description of the Related Art

The fabrication of advanced integrated circuits, such as CPU's, memory devices, ASIC's (application specific integrated circuits) and the like, requires the formation of a large number of circuit elements in a given chip area according to a specified circuit layout. Metal-Oxide-Field-Effect-Transistors (MOSFETs) represent one dominant type of circuit element that substantially determines performance of the integrated circuits. MOSFETs are typically either an N-type (NFET) device or a P-type (PFET) device and they are complementary to each other (thus, when both types are used in an integrated circuit product, the technology is referred to as C-MOSFET or CMOS technology). During the fabrication of complex integrated circuits, millions of CMOS transistors, e.g., NFETs and/or PFETs, are formed on a substrate including a crystalline semiconductor layer. A field effect transistor, irrespective of whether an NFET or a PFET is considered, typically comprises so-called PN junctions that are formed by an interface of highly doped regions, referred to as drain and source regions, with a slightly doped or non-doped region, referred to as a channel region, disposed between the highly doped source/drain regions in the substrate. The channel length of a MOS transistor is generally considered to be the lateral distance between the source/drain regions.

In modern semiconductor devices, the gate structures are very small and have a very small distance or pitch between adjacent gate structures. As CMOS device dimensions continue to be reduced in size, e.g., 20-30 nm gate lengths and gate pitches on the order of 60-90 nm at the 20 nm CMOS technology node, the formation of conductive contacts to the source/drain regions of a transistor has become very challenging. Such contacts are typically formed by direct patterning techniques using traditional photolithography and etching techniques. Given the decrease in device dimension, device designers have resorted to making the conductive contacts very small so as to have some tolerance or "process margin" for positioning the contact between adjacent gate structures. If the process margin is not large enough with contact holes that are aligned poorly and near the spacer shoulder of gate structures, the spacers on the sidewall of gate structures can be damaged by the plasma oxide etching during contact formation and result in circuit failures due to the "short" between the contact and the gate electrode. However, when using such techniques, the accuracy in forming such contact openings is very critical. Errors in pattern alignment can ultimately result in the formation of conductive contacts that are even smaller than intended by the device designer. As a result, such excessively small conductive contacts, and the resulting underlying metal silicide regions, can increase the resistance of the contact structure and thereby reduce the performance of the resulting transistors and integrated circuit products incorporating such devices. In a worst case scenario, such misalignment can lead to short circuits and total device failure as described.

Another technique that device designers have developed in an effort to meet the challenge of making contact to the source/drain regions of such very small devices involves the formation of so-called self-aligned contacts (SAC). In general, in a self-aligned contact, the configuration of the opening for the contact is essentially defined by the configuration of adjacent structures, e.g., sidewall spacers on adjacent gate structures. The contact opening and the resulting conductive contact are "self-aligned" in the sense that the location and even the configuration of the final opening is not directly defined by traditional patterning and etching techniques. Rather, a "self-aligned" contact is essentially formed in the opening that is defined by selectively etching one material, e.g., silicon dioxide, relative to other materials, such as silicon nitride sidewall spacers on adjacent gate structures. One typical self-aligned contact (SAC) process involves performing a first plasma etching process on a layer of insulating material, e.g., silicon dioxide, to define the contact opening. This first etching process is performed until the underlying etch stop layer, e.g., silicon nitride, is exposed. Thereafter, a second plasma etching process is performed on the exposed etch stop layer until such time as the underlying source/drain region that is formed in the substrate is exposed.

The silicon nitride etch stop layer (which was also deposited on the upper portion of the gate structures and the sidewall spacers) needs to be highly resistant to the etch chemistry employed in the first plasma etching process performed on the insulating material, e.g., silicon dioxide, to insure the integrity of the gate encapsulation is not jeopardized. The silicon nitride etch stop layer should also be of sufficient thickness along the side of the gate structures to withstand the second plasma etch process that etches through the silicon nitride etch stop layer and exposes the source/drain region.

The first plasma etching process, which is typically performed to etch a layer of silicon dioxide, is performed using a plasma based etch process with an etch chemistry that is a combination of carbon and fluorine containing gases (e.g., $C_4F_8/CH_2F_2/Ar$, or $C_4F_6/CO/Ar$, etc.). Polymer formation during the first plasma etching process is a key factor in maintaining an anisotropic and vertical profile for the contact opening and in protecting the upper portion of the silicon nitride etch stop layer on the gate structures as well as the etch stop layer positioned on the sidewall spacer of the gate structure. If there is no polymer production during the first plasma etching process (the etching of the silicon dioxide insulating layer) and the second plasma etching process (the etching of the silicon nitride etch stop layer), then the upper shoulder of the silicon nitride etch stop layer may be completely consumed, which can lead to the formation of a short circuit between the gate electrode and the contact. If there is too much polymer formation during the first plasma etching process, then it may be difficult to break through the etch stop layer during the second plasma etching process that is performed to expose the source/drain region. Such a condition may result in an "open" contact which can lead to device failure.

The use of self-aligned contacts (SAC) in memory devices has been employed for several years. In a memory array, to the extent that there are defects in the formation of such self-aligned contacts (SAC) in the memory array, e.g., a short circuit was created between the conductive contact and the cells, such a problem could be readily addressed in such a memory array by using well-known redundancy schemes, i.e., redundant memory cells and repair control circuits. However, when logic circuits, such as microprocessor circuits, are involved, it is much more difficult to locate where such an error or defective contact is located, and there is limited and costly capability for fixing such problems in a logic circuit and then only when such defective contacts happen to be located in a redundant circuit block. As a result, in some cases, even one defect in forming conductive contacts to the source/drain regions of a transistor device can result in complete circuit failure with the attendant loss of yield and increased production costs. Even when repairs are possible, there is a very low success rate on such repairs. Thus, for logic circuits, the formation of self-aligned contacts (SAC) must be much more accurate and defect-free than the self-aligned contact (SAC) formation processes used in memory devices.

There have been attempts to improve the accuracy and reliability of the processes used to form self-aligned contacts (SAC). For example, current improvement methods focus on enhancing the etch selectivity between a silicon dioxide insulating layer and a silicon nitride etch stop layer by fine-tuning the plasma etch chemistry for such materials, e.g., using $C_4F_6$ or $C_5F_8$ gases with better control of the ratio of carbon to fluorine for controlling polymer generation. Another technique that has been employed to improve self-aligned contact (SAC) formation processes involves using different materials for the etch stop layer, such as silicon or carbon doped materials, silicon-rich silicon oxynitride, aluminum dioxide, etc. One other technique involves carbon doping of the silicon nitride etch stop layer to reduce the nominal etch rate of the original silicon nitride material, but this process is not effective at solving the problems mentioned above as there is still a chance of consuming the etch stop layer in problematic areas identified above. Another technique that has been employed is to try to locally increase the thickness of the etch stop layer near the upper corner of the gate structure. However, this latter approach greatly increases processing complexities and costs by requiring the performance of additional steps such as thin-film deposition, lithography, etching, etc.

The present disclosure is directed to various methods of forming self-aligned contacts (SAC) for semiconductor devices such as transistors that are formed using replacement gate techniques that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming self-aligned contacts (SAC) on semiconductor devices that are formed using replacement gate techniques. As will be appreciated by those skilled in the art after a complete reading of the present application, the present techniques may be employed to form planar field effect transistor devices, as well as on three dimensional devices such as FinFET devices.

One illustrative method disclosed herein involves forming sacrificial gate structures for first and second spaced-apart transistors, forming an etch stop layer above the sacrificial gate structures, performing at least one angled ion implant process to implant at least one etch inhibiting species into less than an entirety of the etch stop layer, and, after performing the angled ion implant process, forming a layer of insulating material above the etch stop layer. In this embodiment, the method further includes performing at least one chemical mechanical polishing process to expose at least a portion of each of the sacrificial gate structures, removing the sacrificial gate structures and thereby defining a plurality of gate cavities, forming a replacement gate structure in each of the cavities, forming a hard mask layer above the replacement gate structures and the layer of insulating material, forming an etch mask above the hard mask layer, performing an etching process on the hard mask layer through the etch mask to thereby define a patterned hard mask layer, performing another etching process through the patterned hard mask layer to define an opening in the layer of insulating material and thereby expose a portion of the etch stop layer, performing another etching process on the exposed portion of the etch stop layer to define a contact opening therethrough that exposes a doped region formed in the substrate, and forming a conductive contact in the opening that is conductively coupled to the doped region. In some embodiments, the etching process may be either a wet or a dry plasma-based process. In the case where the etching process is a plasma-based process, the etching process causes the formation of a polymer material proximate the regions where the etch inhibiting species was implanted in the etch stop layer. In the case where a wet etching process is performed, the wet etching process causes the formation of a protective interfacial layer proximate the regions where the etch inhibiting species was formed.

Another illustrative method disclosed herein involves forming sacrificial gate structures for first and second spaced-apart transistors, forming an etch stop layer above the sacrificial gate structures, performing at least one angled ion implant process to implant at least one polymer forming species into less than an entirety of the etch stop layer, and, after performing the angled ion implant process, forming a layer of insulating material above the etch stop layer. In this embodiment, the method further includes performing at least one chemical mechanical polishing process to expose at least a portion of each of the sacrificial gate structures, removing the sacrificial gate structures, thereby defining a plurality of gate cavities, forming a replacement gate structure in each of the gate cavities, forming a hard mask layer above the replacement gate structures and the layer of insulating material, forming an etch mask above the hard mask layer, performing an etching process on the hard mask layer through the etch mask to thereby define a patterned hard mask layer, performing another etching process through the patterned hard mask layer to define an opening in the layer of insulating material and thereby expose a portion of the etch stop layer, performing a dry plasma etching process on the exposed portion of the etch stop layer to define a contact opening therethrough that exposes a doped region formed in the substrate, wherein performing the dry plasma-based etching process causes formation of a polymer material proximate where the polymer forming species were implanted into the etch stop layer, and forming a conductive contact in the opening that is conductively coupled to the doped region.

BRIEF DESCRIPTION OF THE DRAWINGS

The disclosure may be understood by reference to the following description taken in conjunction with the accompanying drawings, in which like reference numerals identify like elements, and in which.

Figure 1A:
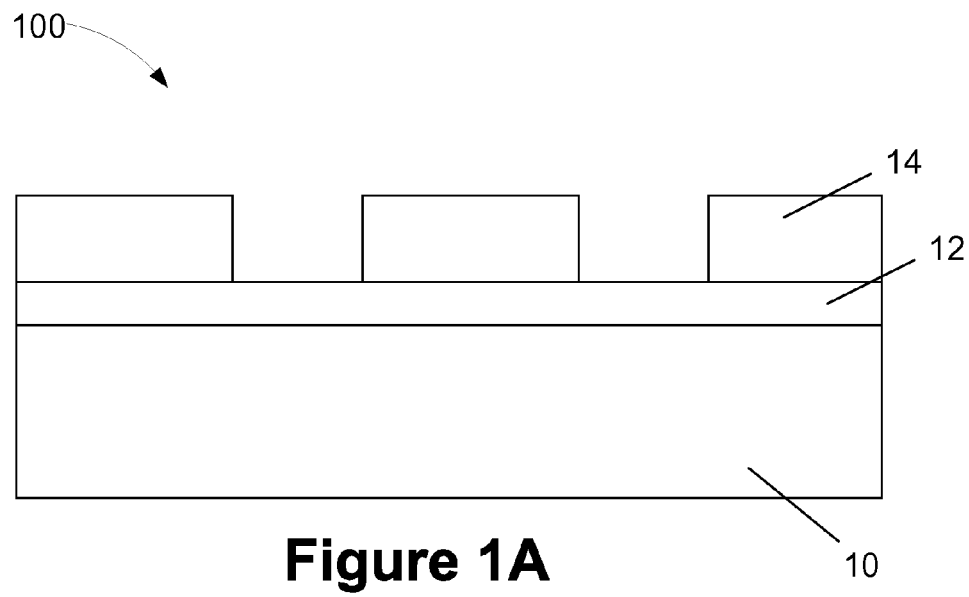
FIGS. 1A-1D depict various illustrative methods disclosed herein for forming a generic hard mask layer that may be employed in a variety of applications as it relates to the fabrication of, for example, integrated circuit products.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming hard mask layers for use in manufacturing semiconductor devices and to the formation of self-aligned contacts (SAC) on semiconductor devices. As will be readily apparent to those skilled in the art upon a complete reading of the present application, the present method is applicable to a variety of devices (e.g., planar devices and non-planar devices such as FinFETs) and technologies, e.g., NFET, PFET, CMOS, etc., and is readily applicable to a variety of integrated circuit products, including, but not limited to, ASIC's, logic devices, memory devices, etc. With reference to the attached drawings, various illustrative embodiments of the methods disclosed herein will now be described in more detail.

FIGS. 1A-1D depict various illustrative methods disclosed herein for forming a generic hard mask layer that may be employed in a variety of applications as it relates to the fabrication of, for example, integrated circuit products. As shown in FIG. 1A, a layer of hard mask material 12 is formed above a structure 10. The structure 10 is intended to be representative of any type of structure or layer of material, such as those that may be employed in manufacturing integrated circuit products. For example, the structure 10 may be a semiconducting substrate, a layer of metal (or its nitride or oxide), a layer of insulating material, a layer of polysilicon, a layer of gate electrode material, etc. The layer of hard mask material 12 may comprised of a variety of different materials, e.g., silicon nitride, silicon dioxide, a metal, oxides or nitrides of metals, such as titanium, tantalum, aluminum, tungsten, etc., its thickness may vary depending upon the particular application, e.g., less than 100 nm, and it may be formed by a variety of techniques, e.g., chemical vapor deposition (CVD), physical vapor deposition (PVD), atomic layer deposition (ALD), etc. In one illustrative embodiment, the layer of hard mask material 12 may be a layer of silicon nitride that has a thickness of about 30 nm that was formed by performing a CVD process.

Also depicted in FIG. 1A is an illustrative patterned implant mask 14 that is patterned to expose portions of the layer of hard mask material 12 for further processing. In one illustrative embodiment, the patterned implant mask 14 is a patterned layer of photoresist material that was formed using traditional photolithography tools and techniques.

Figure 1B:
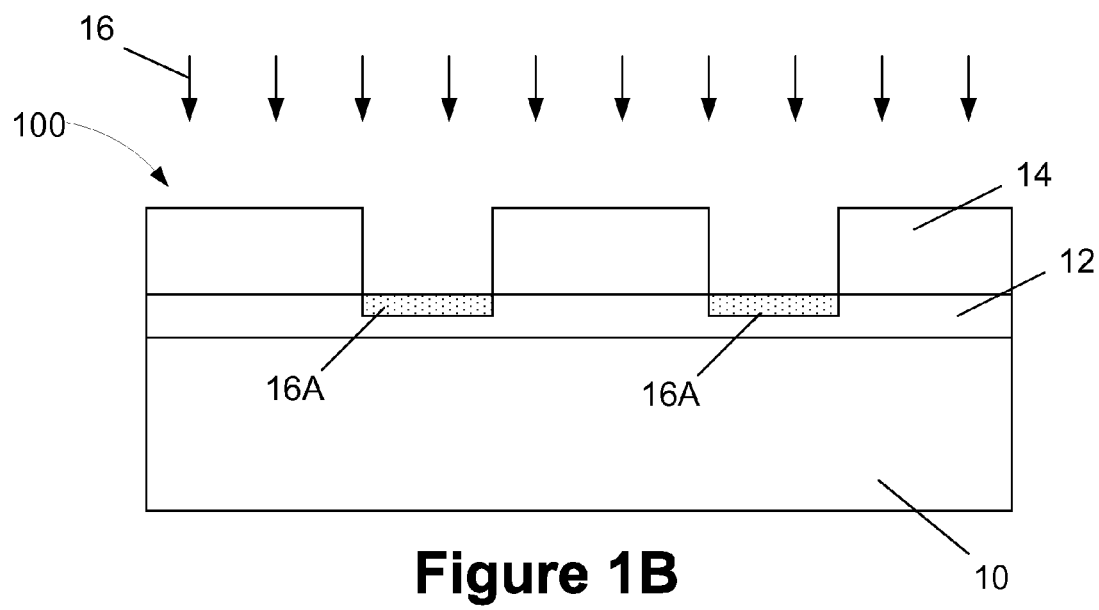

Next, as shown in FIG. 1B, an ion implant process 16 is performed through the patterned implant mask 14 to form implant regions 16A in the layer of hard mask material 12. In one illustrative example, the ion implant process may be performed to implant an "etch-inhibiting" species such as fluorine (F), carbon (C), nitrogen (N) or a combination of such materials with various implant dosages and implant energy levels. As described more fully below, the implanted etch-inhibiting species may be employed to effectively increase the etch resistance of the hard mask layer 12 during the performance of either wet or dry (plasma-based) etching processes. In the case of a dry plasma-based etching process, the implanted etch-inhibiting species act with radicals in the plasma process to form polymers that inhibit the etching of the portions of the hard mask layer 12 that have the implant regions 16A formed therein during the dry etching process as compared to other portions of the hard mask layer 12 where the etch-inhibiting species was not implanted. In the case of a wet etching process, the ions in the etch solution bath tend to act with the implanted etch-inhibiting species to form a protective "interfacial" layer between the surface of the hard mask layer 12 and the solution to thereby locally reduce the etch rate of the hard mask material by the wet etching solution. This technique is effective especially for "buffered" wet etching solutions where significant amounts of carbon (C), fluorine (F), and nitrogen (N) radicals are added to the etching solution. The protective interfacial layer formed between the implanted surface of the hard mask layer and the wet etching solution effectively reduces the etching rate in the region where the protective interfacial layer is formed. The magnitude of the reduction of the etching rate using this wet etching technique is similar to the reduction in etch rate that is obtained when the protective polymer material is formed in the case where plasma etching is employed.

The parameters of the ion implant process 16 may vary depending upon the particular application. For example, the ion implant process 16 may be performed using an implant dose in the range of $10^{14}$-$10^{16}$ ions/cm$^2$ and at multiple energy levels in the range of 1-500 keV. In one particularly illustrative example, where a dry plasma etching process is to be performed, if the expected polymer chain is based upon $CF_2$ radicals, then the ion implant process 16 may be performed using carbon and fluorine (in a ratio of about 1:2 (for matching the ratio of carbon and fluorine in the polymer material)) with an implant dose of about $10^{15}$ ions/cm$^2$ and at an energy level of about 1-10 keV such that the polymer material is formed near the surface of the hard mask layer 12. The depth of the implant regions 16A may vary depending upon the particular application and it may be controlled by controlling the implant energy of the implant process. In one illustrative example, where the layer of hard mask material 12 has an as-formed thickness of about 30 nm, the implant regions 16A may have a target depth of about 10-15 nm. As mentioned above and as will be described more fully below, in some embodiments disclosed herein, the etch-inhibiting species (C, F, N, etc.) in the implant regions 16A are essentially polymer forming species that will serve as seeding sites for polymerization, e.g., C—F polymerization, during a subsequent plasma etching process that is performed on the layer of hard mask material 12 and on the substrate materials 10 below the hard mask material 12. In one embodiment, the nitrogen atoms serve as a catalyst for nucleation in the polymerization process. Other species can also be easily added by implantation techniques for particular applications. The relative amount of polymer formation species in the implanted hard mask layer 12 may typically match those expected polymers formed in the subsequent plasma etching of the hard mask layer 12 and the substrate material 10 for most efficient polymer formation. In the case of a wet etching process, the parameters of the ion implant process may be similarly optimized as those described immediately above to obtain the most efficient reduction of the etch rate for various etchants that are used in such wet etching process. As mentioned above, during the wet etching process, the etch-inhibiting species (C, F, N, etc.) in the implant regions 16A will tend to act with the radicals in the chemical bath to form a thin protective interfacial layer on the surface of the implant regions 16A that will tend to reduce the etch rate of the hard mask layer 12 that contain or are very near the implant regions 16A. As the chemistry, science and plasma etching technology progresses, the etch inhibiting species will likely not be limited to the illustrative one specifically discussed herein (e.g., C, F, and N). Rather, additional etch inhibiting species, such as Cl, B, P, As, O, S, H, etc., may be employed depending upon a variety of factors, such as, for example, the specific materials involved, the specific radicals or ions present in the wet or plasma etch chemistry, etc.

Figure 1C:
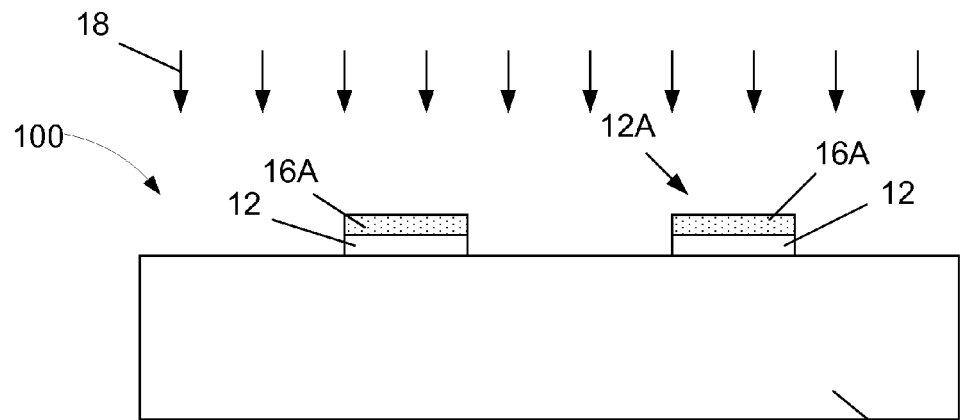

FIG. 1C depicts the device 100 after several process operations have been performed. First, the patterned implant mask 14 was removed by performing, for example, an oxygen-plasma ashing process. Next, the layer of hard mask material 12 is exposed to an etching process 18 to thereby define a patterned layer of hard mask material 12A. As noted above, the etching process 18 may be either a wet etching process or a dry, plasma-based etching process. In one illustrative embodiment, where the etching process 18 is a dry, plasma-based etching process, the process gases used in the dry, plasma-based etching process 18 may include $C_4F_8/CH_2F_2/Ar$, $C_4F_6/CO/Ar$, $C_4F_6$, or $C_5F_8$ based, etc., and an additive gas of nitrogen ($N_2$). The process parameters of such an illustrative dry, plasma-based etching process 18 (i.e., gas flow ratio, $N_2$ additive, chamber pressure, temperature, and RF power, etc.) determine the sidewall profile, etching rate at vertical/horizontal (isotropic vs. anisotropic) directions, the rate of polymer formation and removal rates. Typical operating parameters of such a dry plasma-based etching process 18 may be pressures is in the range of 20 mTorr-10 Torr, gas flow rates in the range of 1-100 sccm, chamber temperatures in the range of 20-200° C., and RF power settings in the range of 100-1 kW with multiple frequencies. As noted above, during the dry plasma-based etching process 18, the "polymer-forming" species in the implant regions 16A serve as seeding sites for adsorption (or deposition) of polymer radicals (not shown), e.g., C—F polymer material on the surface of the implant regions 16A. The larger chemical bond formation energy of C—F bonding (e.g., about 525 kJ/mol) favors the formation of C—F bonds than other chemical bonds during the illustrative dry plasma-based etching process 18. Once the surface of the implant regions 16A is covered with the polymer material, the carbon (C) and fluorine (F) radicals in the plasma will perform both adsorption (deposition) or de-sorption (etching) actions dynamically. If deposition rate is faster than the de-sorption rate, then polymer will accumulate on the surface; if the deposition rate is less than the adsorption rate, no polymer material will form on the surface of the hard mask layer 12 and such regions are thus exposed to the plasma etching process. The presence of the polymer material effectively reduces the etch rate of those portions of the hard mask material 12 where the implant regions 16A are formed. As a result, the portions of the layer of hard mask material 12 that do not have the implant regions 16A formed therein, i.e., the portions of the layer of hard mask material 12 that are not "covered" by the implant regions 16A, may be readily removed during the etching process 18.

In the case, where the etching process 18 is a wet etching process and the hard mask layer is made of silicon nitride, the wet etching process may be performed using phosphorous acid ($H_3PO_4$) with additives for etching silicon nitride. As is well-known, the additives (or "buffer" agents) added to a wet etching bath are primarily used to stabilize the active etchants and to achieve an approximately constant etch rate. The additives for stabilizing $H_3PO_4$ are usually HF, acetic acid, (thus containing F and C radicals in solution) with a concentration of a few percent (in volume). The parameters of the wet etching process 18, such as temperature, chemical concentration, buffer agents, and duration, may vary depending upon the particular application. In one illustrative embodiment, where the hard mask layer 12 is comprised of silicon nitride, the wet etching process 18 may be performed using buffered phosphorous acid ($H_3PO_4$) as the etchants and the wet etching process 18 may be performed at a temperature of about 25-150° C. If the hard mask layer 12 is comprised of silicon dioxide, then the wet etching process 18 may performed by using HF solutions (diluted and/or buffered).

Figure 1D:
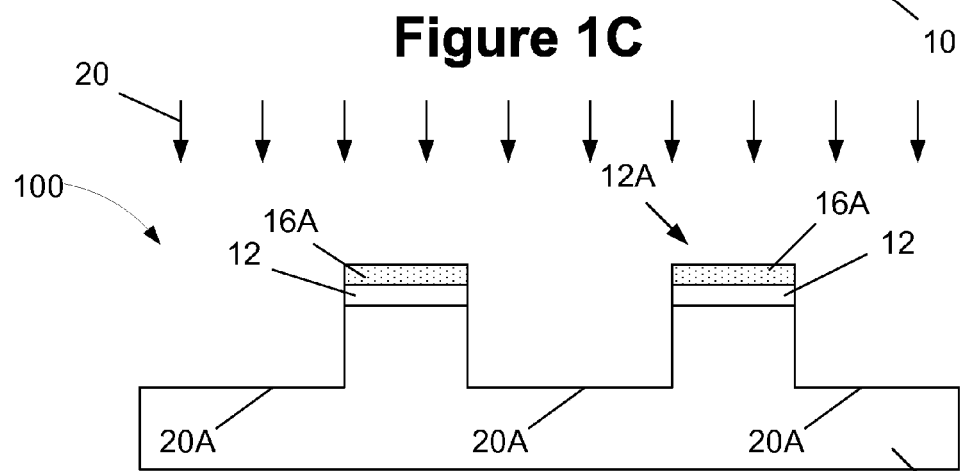

After the patterned hard mask layer 12A is formed, as shown in FIG. 1D, an etching process 20, e.g., a wet or dry (plasma-based) etching process may be performed on the structure layer 10 through the patterned hard mask layer 12A. In the example depicted in FIG. 1D, the etching process 20 defines a plurality of trench-type features 20A in the structure layer 10. Of course, the patterned hard mask layer 12A may be employed to define any type of feature, e.g., line-type features, hole-type features, vias, etc. In the case where the etching process 18 is a dry plasma-based etching process, the polymer material that was formed during the dry plasma-based etching process 18 may be left in place during the etching process 20 or it may be removed prior to performing the etching process 20. For example, prior to performing the etching process 20, the polymer material may be removed by subjecting the device to a wet HF acid cleaning process. Similarly, in the case where the etching process 18 is a wet etching process, the protective interfacial layer that is formed on the certain surface portions of the hard mask layer 12, i.e., in the areas near the implant regions 16A, it may be left in place during the etching process 20 or it may be removed prior to performing the etching process 20. For example, prior to performing the etching process 20, the protective interfacial layer may be removed by subjecting the device to a DI water rinse or diluted acid cleaning process at elevated temperatures. Note that etching processes 18 and 20 can be performed sequentially in one chamber by using both dry (plasma) etching or both wet etching steps. Also, the profile of the feature etched in the structure 10 is entirely determined by the nature of etching process 20 (e.g., an isotropic or anisotropic etching process), while the etch inhibiting species in implant regions 16A only protects the hard mask material 16 from consumption.

Interestingly, in the case where the etching process 18 is a dry plasma-based etching process, the substantially continuous generation of polymer material during the dry plasma-based etching process 18 prevents any substantial consumption of the hard mask layer 12. That is, unlike prior art hard mask layers and photoresist masking layers that would be consumed to a substantial degree, if not entirely, the polymer formation described herein effectively prevents or reduces a substantial consumption of the hard mask layer 12 where the polymer material is formed. Thus, if desired, the hard mask layer 12 can be very thin (or simply skipped) and still can serve as an effective etch mask.

Figure 1E:
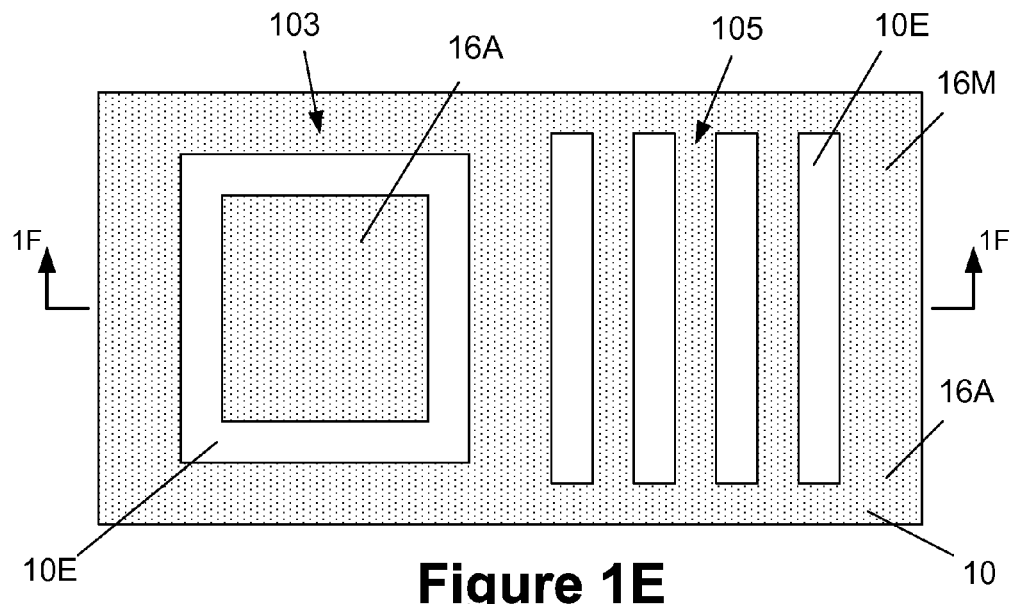
FIGS. 1E-1F depict a particular embodiment disclosed herein wherein an etch mask comprised of a plurality of implant regions may be formed and used to etch various features in a substrate.
Figure 1F:
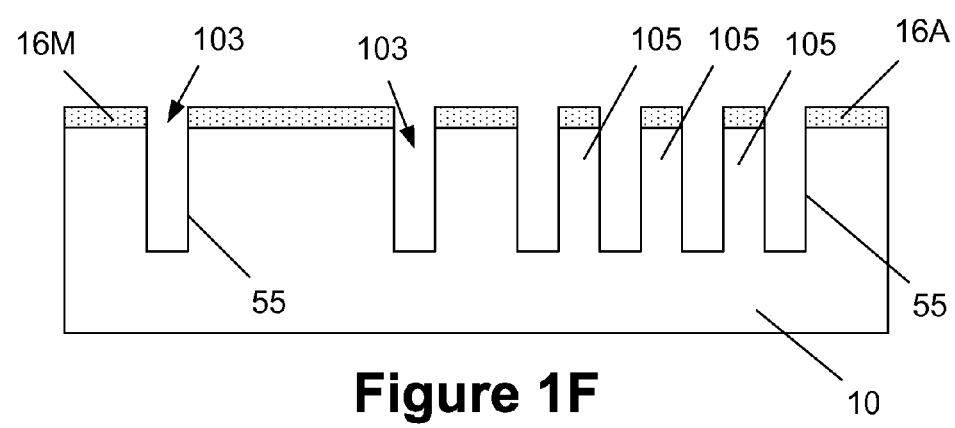

Moreover, with reference to FIGS. 1E (plan view) and 1F (cross-sectional view), in some cases, an ion implantation etch mask 16M comprised of one or more implant regions 16A may be formed in the structure 10 so as to define non-implant regions 10E of the structure 10 that are desired to be etched. Thereafter, an etching process may be performed to define various features in the structure 10. That is, using the methods disclosed herein, various features may be directly formed in the structure 10, e.g., a plurality of trenches, without having to form a separate etch mask, such as a patterned hard mask or an etch mask made of photoresist material above the structure 10. For example, as shown in FIG. 1E, the ion implant process 16 may be performed to form various implant regions 16A, i.e., the ion implantation mask 16M, in the structure 10. The implantation mask 16M (that is comprised of one or more implant regions 16A) effectively defines the non-implant regions 10E of the structure 10 that are to be etched. In the example depicted in FIG. 1E, where the structure 10 is a semiconducting substrate, the etch mask 16M may define a portion of the non-implant regions 10E of the substrate where a shallow trench isolation (STI) region 103 will be formed as well as non-implant regions 10E of the substrate that will be etched to thereby form a plurality of fins 105 for a FinFET device. As shown in FIG. 1F, one or more etching processes may be performed through the implant etch mask 16M to define various trenches 55 in the substrate that define in whole or part the isolation structure 103 and the fins 105. Of course, those skilled in the art will recognize that additional operations need to be performed to complete the fabrication of the isolation structure 103 (e.g., fill with insulating material and polish) and the rest of steps to complete the FinFET device. Due to the formation of the polymer material during a dry plasma-based etching process, the portions of the substrate where the implant regions 16A are formed are effectively protected from the etching process. Stated another way, if the implant regions 16A are formed directly in the structure 10, then the polymer will also be formed on the surface of the structure 10 where those implant regions 16A are located and thereby act as a patterned etch mask comprised of a plurality of spaced-apart implant regions 16A (that contain the implanted etch-inhibiting species) during the subsequent etching of structure material 10. In effect, the processes described herein result in a patterned etch mask comprised of a plurality of spaced-apart implant regions 16A, and the structure 10 may be patterned without requiring the formation of a separate patterned layer of hard mask material that acts as an etch mask above the structure 10. Rather, in the case where a patterned etch mask comprised of a plurality of spaced-apart implant regions 16A is formed in the structure 10, the structure 10 may be patterned by subjecting the entirety of the structure 10 to the etching process and without the need of going through the process complexity and expense of forming a separate patterned etch mask layer above the structure 10. Of course, as noted above, the structure 10 is generic in nature, as it may be, for example, a semiconducting substrate, a layer of insulating material, etc., and a variety of different features may be defined in the structure 10, such as the aforementioned isolation structure 103, fins 105, trenches for metal wiring lines, etc. Similarly, due to the formation of the protective interfacial layer during a wet etching process, the regions of the structure 10 where the implant regions 16A are formed are effectively protected from the wet etching process.

Figure 2A:
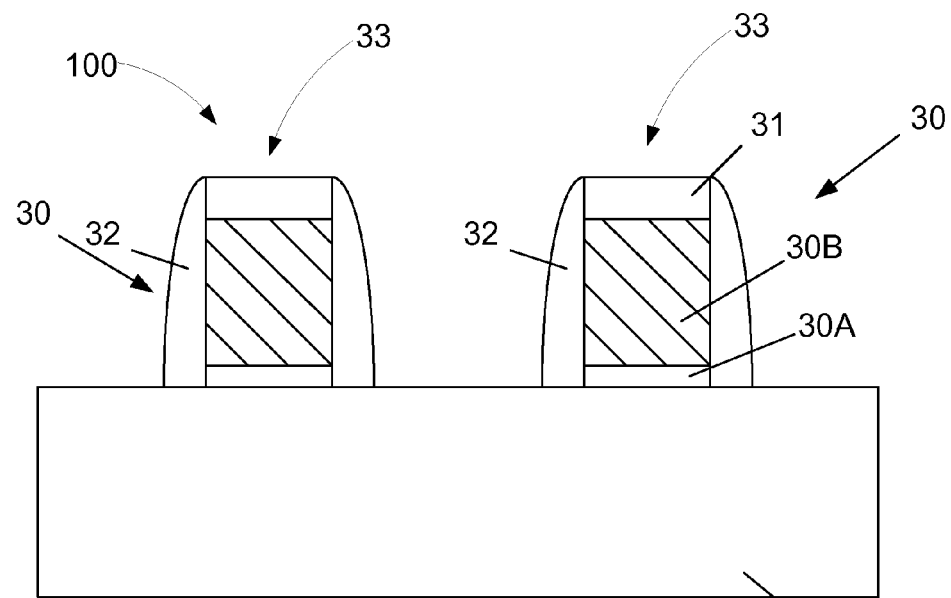
FIGS. 2A-2G depict various illustrative methods disclosed herein for forming self-aligned contacts for an integrated circuit product.

FIGS. 2A-2G depict various illustrative methods disclosed herein for forming self-aligned contacts for an integrated circuit product. FIG. 2A is a schematic depiction of a device 100 that includes a plurality of illustrative transistors 33. Each of the transistors 33 is formed in an active area of a semiconducting substrate 101. Of course, in a real-world product, there may be millions or thousands of such transistors 33 on the device 100. The substrate 101 may have a variety of configurations, such as the depicted bulk silicon configuration. The substrate 101 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 101 may also be made of materials other than silicon.

FIG. 2A depicts the device 100 at a point in fabrication wherein source/drain regions (not shown) have been formed in the substrate 101 between the transistors 33 and the next major activity to be performed involves the formation of conductive contact structures and metal silicide regions in the source/drain regions of the device 100. Each of the transistors 33 may be N-type transistors or P-type transistors, or one may be an N-type transistor and a P-type transistor. In one example, the transistors may have basically the same configuration. The transistors 33 each comprise a schematically depicted gate structure 30 (comprised of a gate insulation layer 30A, one or more conductive gate electrode layers 30B) and a gate cap layer 31, made of a material such as silicon nitride, and sidewall spacers 32, made of a material such as silicon nitride.

The gate structures 30 depicted herein are intended to be schematic and representative in nature, as the materials of construction used in the gate structures for one of the transistors 33, e.g., an N-type transistor, may be different than the gate structure 30 for the other transistor, e.g., a P-type transistor, which may have multiple layers of conductive metal, etc. However, in some applications, the gate structures 30 may be comprised of the same basic materials, e.g., both of the gate structures 30 may comprise a silicon dioxide gate insulation layer 30A and a polysilicon gate electrode 30B. In general, the gate insulation layer 30A may be comprised of a variety of materials, such as silicon dioxide, silicon oxynitride, a high-k (k value greater than 10) insulating material. The gate electrode 30B may be comprised of one or more layers of conductive materials, such as polysilicon, a metal (aluminum or tungsten), a metal nitride or carbide (e.g., TaN, TaC, TiC, TiN), etc. The gate structures 30 depicted in FIG. 2A may be formed by performing a variety of known techniques. For example, the layers of material that make up the illustrative gate insulation layer 30A, the gate electrode 30B and the gate cap layer 31 may be blanket-deposited above the substrate 101 and, thereafter, one or more etching process are performed through a patterned mask layer (not shown) to define the basic gate structures 30 and the gate cap layer 31 depicted in FIG. 2A. Moreover, the gate insulation layers and gate electrodes in the gate structures 30 may be the final gate insulation layers and gate electrodes to be used on the production device or they may be sacrificial structures that may be later removed and replaced with final gate insulation layers and gate electrodes for the finished device using well-known "replacement gate" (RMG) formation techniques. That is, the gate structures 30 may be sacrificial gate structures or final gate structures as it relates to the formation of the finished device. The sidewall spacers 32 may be formed by performing a conformable deposition process to form a layer of spacer material above the device 100 and thereafter performing an anisotropic etching process. Moreover, as will be appreciated by one skilled in the art after having read the present application, the methods disclosed in FIGS. 2A-2G may be employed on planar field effect transistor devices as well as on three dimensional devices such as FinFET devices.

Figure 2B:
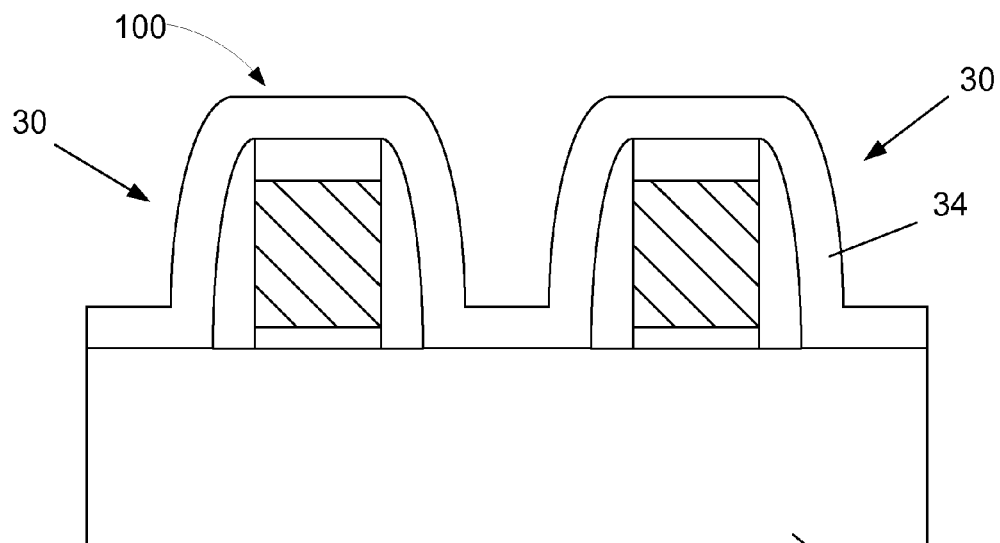

Next, as shown in FIG. 2B, an etch stop layer 34 is conformably deposited above the device 100. The etch stop layer 34 may be comprised of a variety of different materials, e.g., silicon nitride, silicon oxynitride, etc., its thickness may vary depending upon the particular application, e.g., 20-100 nm, and it may be formed by a variety of techniques, e.g., chemical vapor deposition (CVD), atomic layer deposition (ALD), etc. In one illustrative embodiment, the etch stop layer 34 may be a layer of silicon nitride that has a thickness of about 30 nm that was formed by performing a CVD process.

Figure 2C:
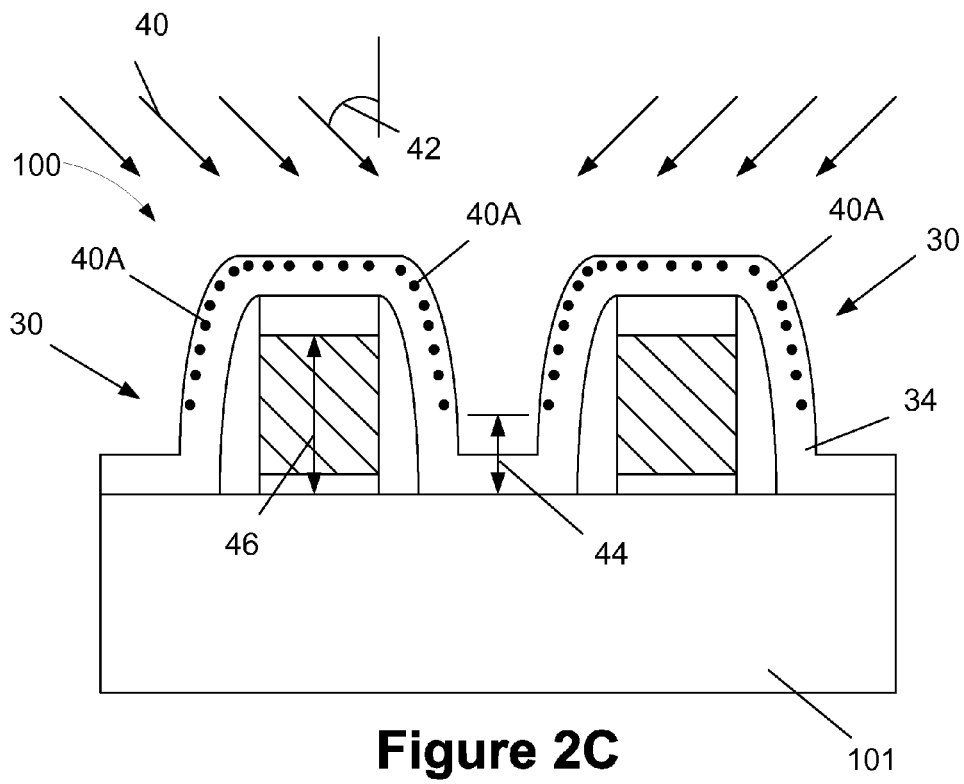

Then, as shown in FIG. 2C, a plurality of angle implant processes 40 is performed to implant schematically depicted etch-inhibiting species 40A into portions of the etch stop layer 34. The etch-inhibiting species employed and parameters of the implant process 40 may be the same as those described previously for the implant process 16. The implant process 40 is performed at a relatively high implant angle 42 to insure that the etch-inhibiting species 40A are not implanted into the entirety of the etch stop layer 34. More specifically, the implant angle 42 is selected such that, due to the shadowing effects of the adjacent transistor, the etch-inhibiting species 40A will not be implanted into the etch stop layer 34 in the level or region defined by the vertical height 44. The magnitude of the dimension 44 may vary depending upon the particular application and the thickness of the etch stop layer 34 in the device under construction. For example, the gate pitch, the height 46 of the gate structure 30, and the selection of the implant angle 42 will have an impact on the amount of shadowing from adjacent structures during the implant process 40. In one illustrative embodiment, the implant angle 42 may fall within the range of about 20-60° (relative to the vertical), and the distance 44 may be about 30% of the height 46 of the gate structure 30 of the transistors 33 or slightly thicker than the etch stop layer 34. In one illustrative example, the dimension 44 may be about 20 nm above the etch stop layer 34, e.g., the dimension 44 may fall within the range of about 20 to 50 nm.

Stated another way, the angled implant process 40 is performed at an angle 42 such that one of the transistors prevents the implantation of the etch-inhibiting species 40A into the entirety of the etch stop layer 34 positioned proximate a side of the other of the transistors 33. Stated yet another way, the angled implant process 40 is performed at an angle 42 such that a portion of the etch stop layer 34 between the two transistors is not implanted with the etch-inhibiting species 40A. In another embodiment, the angled implant process 40 is performed at an angle 42 such that portions of the etch stop layer 34 within the vertical distance 44 of the surface of the substrate 101 that corresponds to approximately 30% of a gate height 46 of one of the gate structures of the transistors 33 is not implanted with the "etch-inhibiting" species 40A. In yet another embodiment, the angled implant process 40 is performed at an angle 42 such that only portions of the etch stop layer 34 that are positioned a vertical distance above the surface of the substrate 101 that is greater than a distance that corresponds to approximately 30% of a gate height 46 of one of the gate structures 30 is implanted with the etch-inhibiting species 40A.

Of course, as will be appreciated by those skilled in the art, the angled implant process 40 can be a two-twist implantation process wherein a first part of the implant process 40 is performed to implant the etch-inhibiting species 40A into the etch stop layer 34 on a first side of the transistors 33 and, thereafter, the substrate 101 is rotated 180° and a second part of the implant process 40 is performed to introduce the etch-inhibiting species 40A into the etch stop layer 34 on the other side of the transistors 33. As it relates to implantation angles discussed and claimed herein, all angles are described relative to a vertical axis. Depending upon the specific application, the angled implant process 40 can be performed with multiple twists, e.g., 3, 4 or more, with corresponding substrate rotation angles of 120°, 90°, etc.

Figure 2D:
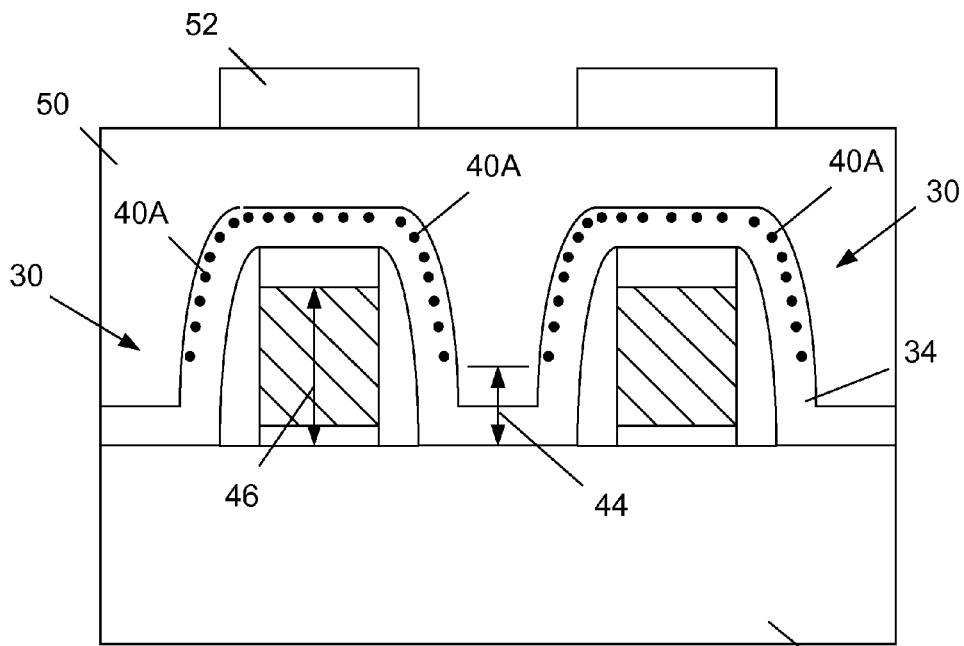

The next sequence of process operations involves the formation of self-aligned contacts to the source/drain regions of the transistors 33. In one illustrative process flow, as shown in FIG. 2D, the process begins with the formation of a layer of insulating material 50 above the device 100 and the formation of a patterned etch mask 52 above the layer of insulation material 50. In general, the layer of insulating material 50 may be comprised of a variety of materials, such as silicon dioxide, a low-k (k value less than 3.5) insulating material, and it may be formed by a variety of techniques, e.g., CVD, ALD, etc. In one illustrative embodiment, the layer of insulating material 50 may be a layer of silicon dioxide that was formed by performing a CVD process. The layer of insulating material 50 may be deposited by performing a conformal deposition process, and it is often planarized by performing a chemical mechanical polishing (CMP) process (as shown in FIG. 2D). The patterned etch mask 52 exposes portions of the layer of insulating material 50 for further processing. In one illustrative embodiment, the patterned etch mask 52 is a patterned layer of photoresist material that was formed using traditional photolithography tools and techniques. The patterned etch mask 52 may also be a hard mask layer, e.g., a layer of metal.

Figure 2E:
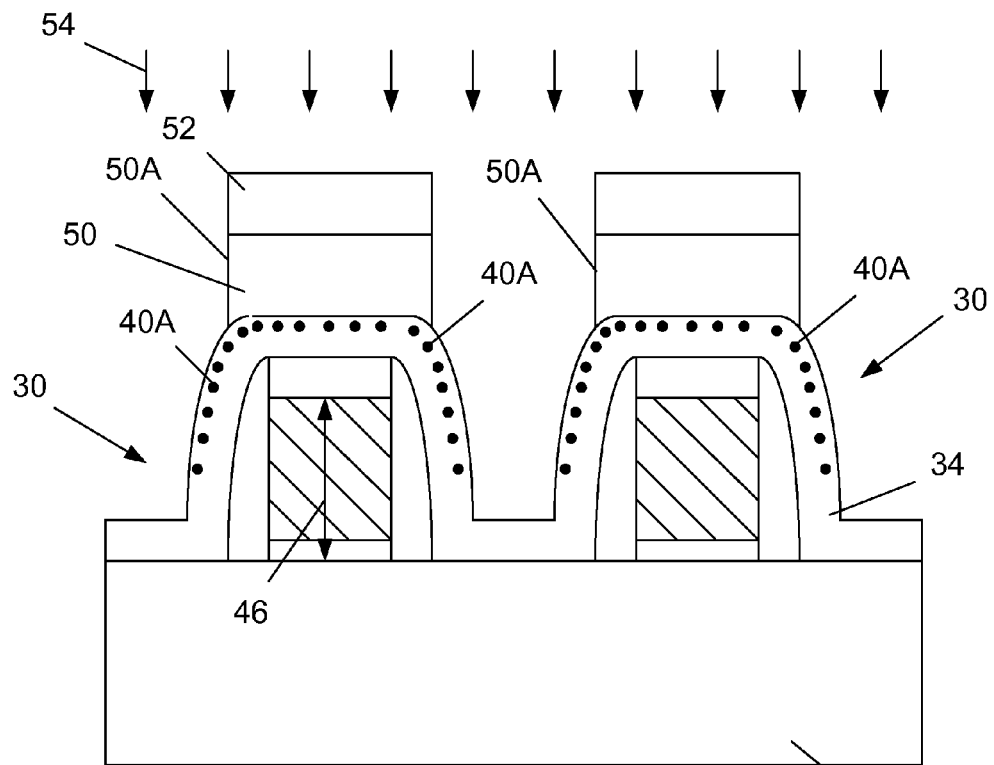

Next, as shown in FIG. 2E, an etching process 54, e.g., a wet or dry etching process may be performed on the layer of insulating material 50 through the patterned etch mask 52. The etching process 54 is typically performed with an etch chemistry that is selective relative to the etch stop layer 34. In the example depicted in FIG. 2E, the etching process 54 defines a plurality of trench-type or hole-type features 50A in the layer of insulating material 50 which exposes portions of the etch stop layer 34 for further processing.

Figure 2F:
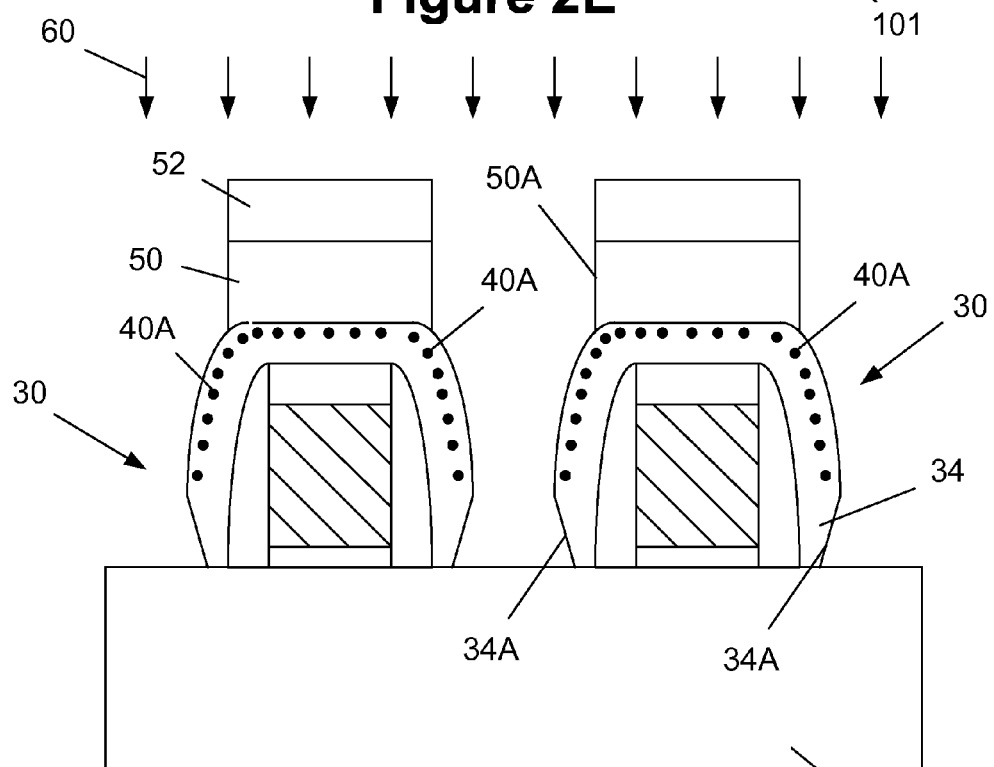

Then, as shown in FIG. 2F, an etching process 60, e.g., a wet or dry (plasma-based) etching process, may be performed on the portions of the etch stop layer 34 that are exposed by the openings 50A in the layer of insulating material 50. In one embodiment, the etching process 60 may be either a wet or dry etching process that is performed using the same parameters as discussed above with respect to the etching process 18. If desired, the etch mask 52 may be left in place during the etching process 60 or it may be removed prior to performing the etching process 60. The etching process 60 is typically performed with an etch chemistry that is selective relative to the substrate material. In the example depicted in FIG. 2F, the etching process 60 defines a plurality of trench-type or hole-type features 34A in the etch stop layer 34 that exposes portion of the source/drain regions (not shown) that are formed in the substrate 101. As discussed above with respect to the discussion of polymer formation during the case where the etching process 18 was a dry plasma-based etching process, during the dry plasma-based etching process 60, the implanted etch-inhibiting species 40A serve as seeding sites for forming polymer material (not shown), e.g., C—F polymer material, on the surface of the etch stop layer 34 where the implanted etch-inhibiting species 40A are located. As noted previously, once the surfaces of the etch stop layer 34 where the implanted etch-inhibiting species 40A are located is covered with the polymer material, the carbon (C) and fluorine (F) radicals in the plasma during the dry, plasma-based etch process 60 will perform both adsorption (deposition) or de-sorption (etching) dynamically. The presence of the polymer material effectively reduces the etch rate of those portions of the etch stop layer 34 where the polymer material is present. However, since the etch-inhibiting species 40A were not implanted into the lower regions of the etch stop layer 34, e.g., the region within the vertical dimension 44 shown in FIG. 2C, the portions of the etch stop layer 34 where such etch-inhibiting species 40A are not present will etch at a faster rate. Thus, the openings 34A may be formed in the lower portion of etch stop layer 34 while the polymer material formed on the portions of the etch stop layer 34 where the etch-inhibiting species 40A are present insures that the gate structures of the device are protected during the contact formation process. The statements above regarding the situation where the etching process 18 is a wet etching process apply equally to this situation where the etching process 60 is a wet etching process.

Figure 2G:
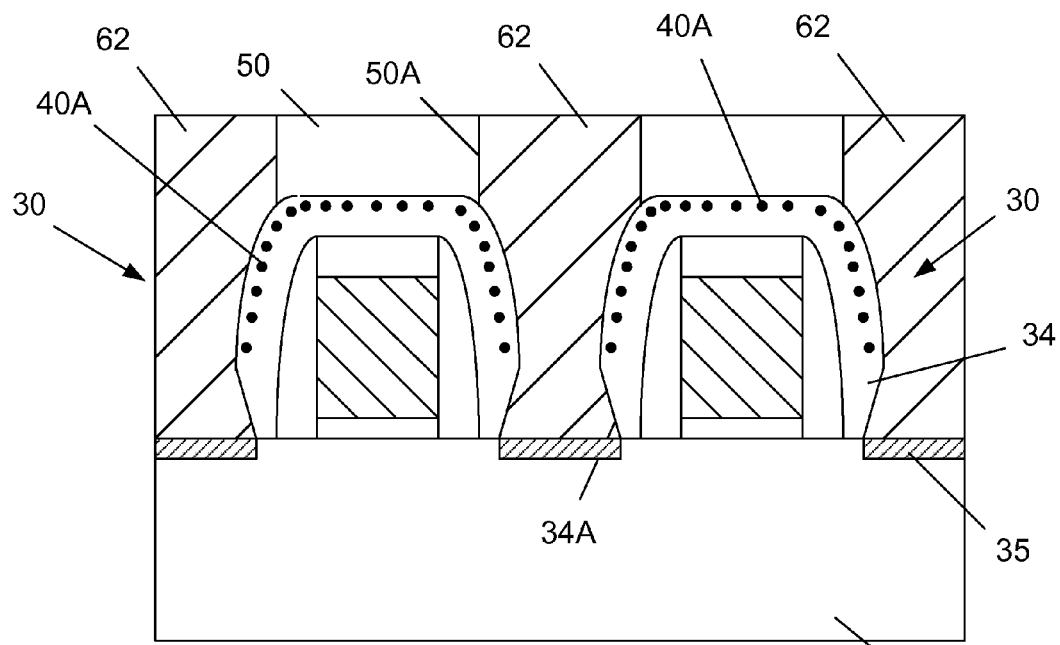

Next, as shown in FIG. 2G, metal silicide regions 35 are formed in the source/drain regions of the device 100 and a plurality of conductive self-aligned contacts 62 are formed in the openings 50A in the layer of insulating material 50. In general, the metal silicide regions 35 are typically formed in the source/drain regions of a transistor to reduce the resistance when a conductive contact is formed to establish electrical connection to the source/drain regions. The metal silicide regions 35 depicted herein may be made using a variety of different refractory metals, e.g., nickel, platinum, cobalt, titanium, etc., or combinations thereof, and they may be formed using techniques that are well known to those skilled in the art. The typical steps performed to form metal silicide regions are: (1) depositing a layer of refractory metal; (2) performing an initial heating process causing the refractory metal to react with underlying silicon containing material; (3) performing an etching process to remove unreacted portions of the layer of refractory metal; and (4) performing an additional heating process to form the final phase of the metal silicide. The details of such silicidation processes are well known to those skilled in the art. Next, the self-aligned contacts 62 are formed in the openings 50A using traditional techniques. In some cases, a relatively thin layer of barrier material (e.g., TaN, TiN) may be formed in the openings 50A, although such a barrier layer is not depicted in the drawings. The self-aligned contact 62 may be comprised of a variety of conductive materials, e.g., Ti, TiN, tungsten, aluminum, copper, etc., and it may be form by depositing the material in the contact opening 50A using, for example, a PVD process, a CVD process, an electroplating process (ECP) and thereafter performing one or more CMP processes to remove excess portions of the conductive material positioned outside of the contact opening 50A.

Figure 3A:
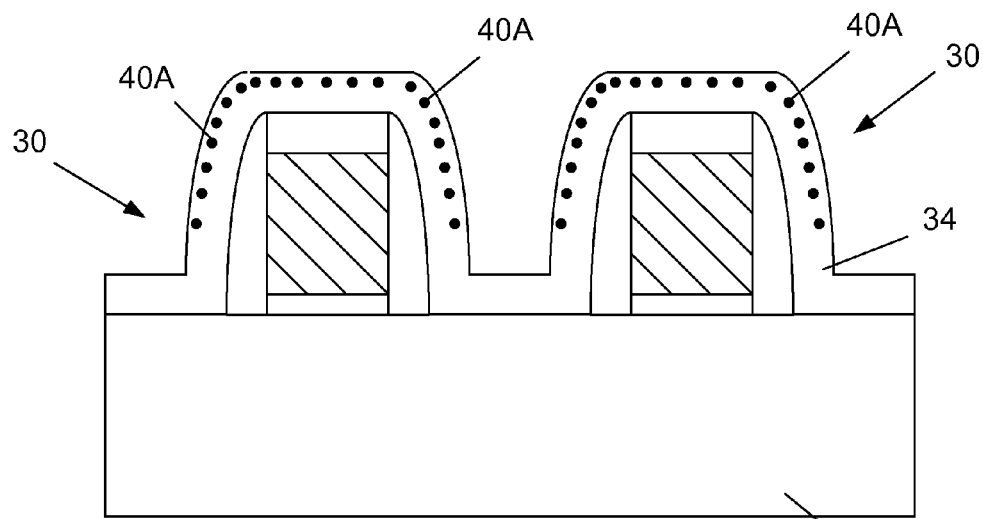
FIGS. 3A-3J depict various illustrative methods disclosed herein for forming self-aligned contacts for an integrated circuit product wherein a "gate-last" or a replacement metal gate technique is employed.

FIGS. 3A-3J depict various specific methods disclosed herein for forming self-aligned contacts for an integrated circuit product wherein a "gate-last" or a replacement metal gate technique (RMG) is employed. FIG. 3A depicts the device at a point wherein the etch-inhibiting species 40A have been implanted into the etch stop layer 34 as previously described. In this illustrative embodiment, the gate structures 30 of the transistors 33 are sacrificial in nature as they will ultimately be replaced with final gate structures using a so-called "gate-last" technique. Moreover, as will be appreciated by one skilled in the art after having read the present application, the methods disclosed in FIGS. 3A-3J may be employed on planar field effect transistor devices as well as on three dimensional devices such as FinFET devices.

Figure 3B:
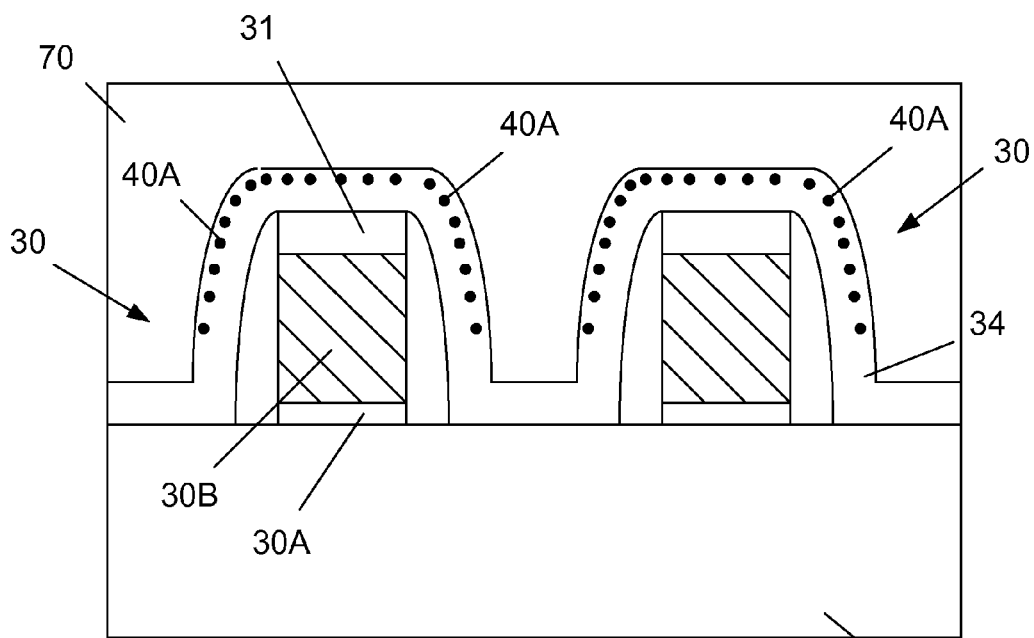

As shown in FIG. 3B, a layer of insulating material 70 is formed above the device 100. If desired or necessary, a CMP process may be performed on the layer of insulating material 70 to planarize its upper surface. The layer of insulating material 70 may be comprised of a variety of materials, such as silicon dioxide, a low-k (k value less than 3.5) insulating material, and it may be formed by a variety of techniques, e.g., CVD, ALD, etc. In one illustrative embodiment, the layer of insulating material 70 may be a layer of silicon dioxide that was formed by performing a CVD process.

Figure 3C:
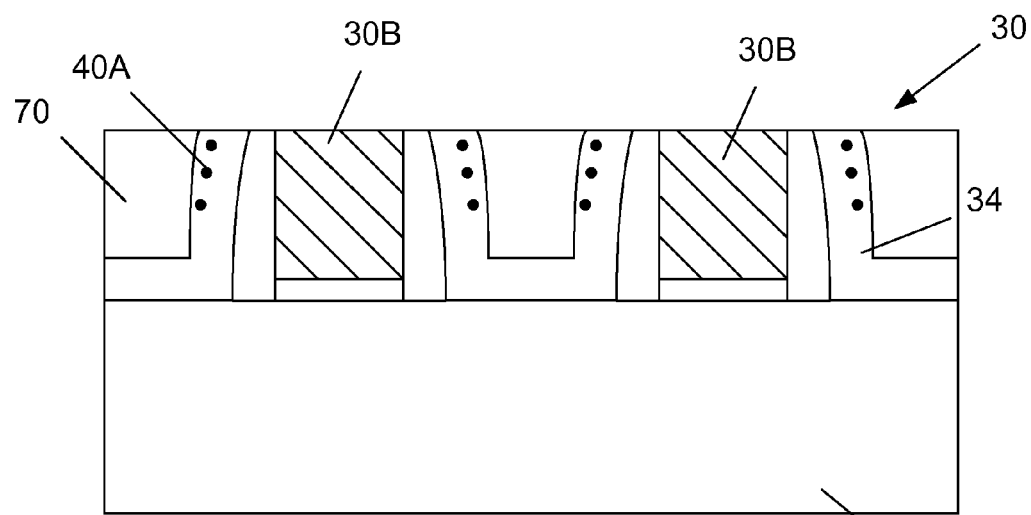

Next, as shown in FIG. 3C one or more CMP processes are performed to remove portions of the layer of insulating material 70, the etch stop layer 34 and the gate cap layer 31. The process results in the exposure of the gate structure 30 (more specifically the gate electrode 30B) for further processing.

Figure 3D:
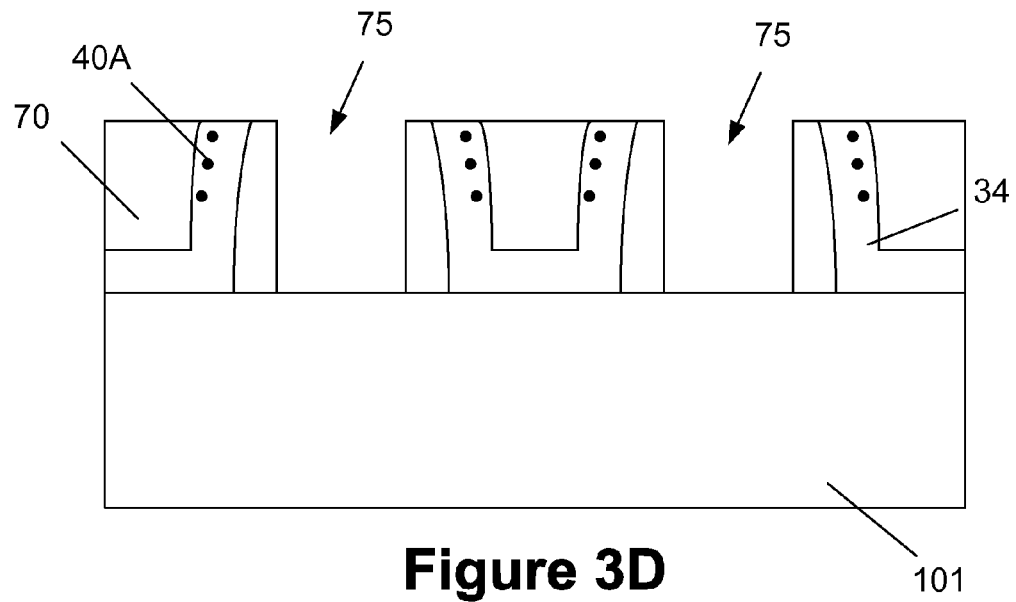

Then, as shown in FIG. 3D, one or more etching processes are performed to remove the sacrificial gate electrode 30B and the sacrificial gate insulation layer 30A to thereby define a gate cavity 75 where a replacement gate structure will subsequently be formed. Typically, the sacrificial gate insulation layer 30A is removed as part of the replacement gate technique, as depicted herein. However, the sacrificial gate insulation layer 30A may also be left in place in some applications.

Figure 3E:
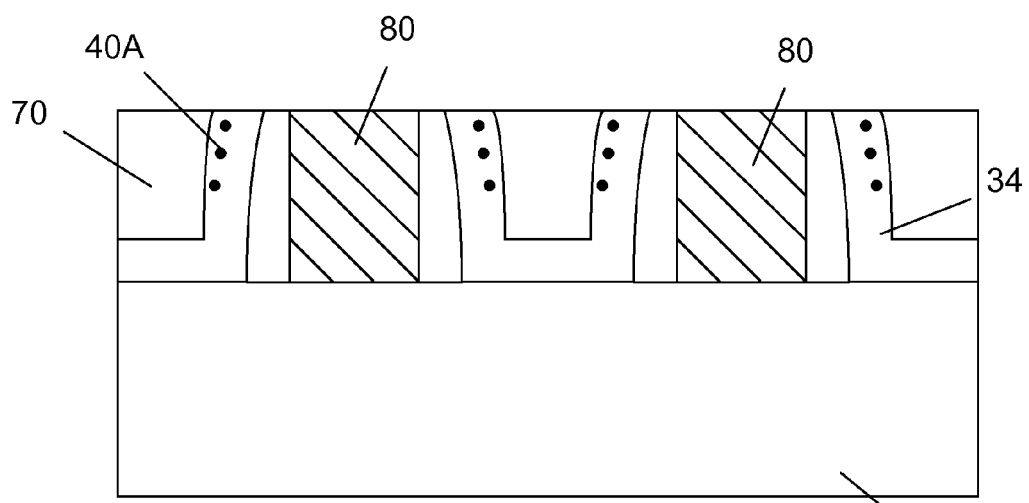

Next, as shown in FIG. 3E, schematically depicted replacement gate structures 80 are formed in the gate cavities 75. In one illustrative example, the replacement gate structure 80 is comprised of a high-k gate insulation layer (not shown) having a work-function adjusting layer (not shown) comprised of a metal (e.g., a layer of titanium nitride) and a bulk metal layer (not shown) (e.g., aluminum). Ultimately, as shown in FIG. 3E, one or more CMP processes are performed to remove excess portions of the gate insulation layer, the work-function adjusting layer and the bulk metal layer positioned outside of the gate cavity 75 to define the replacement gate structure 80. The replacement gate structure 80 depicted herein is intended to be representative in nature. That is, the replacement gate structure may be comprised of a variety of different materials. For example, the replacement gate structure 80 may include a high-k gate insulation layer that is made of tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$), or the like. Furthermore, one or more non-polysilicon metal gate electrode materials may be part of the replacement gate structure. These metal gate electrode materials may include, for example, one or more layers of titanium (Ti), titanium nitride (TiN), titanium-aluminum (TiAl), titanium carbide (TiC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), and the like.

Figure 3F:
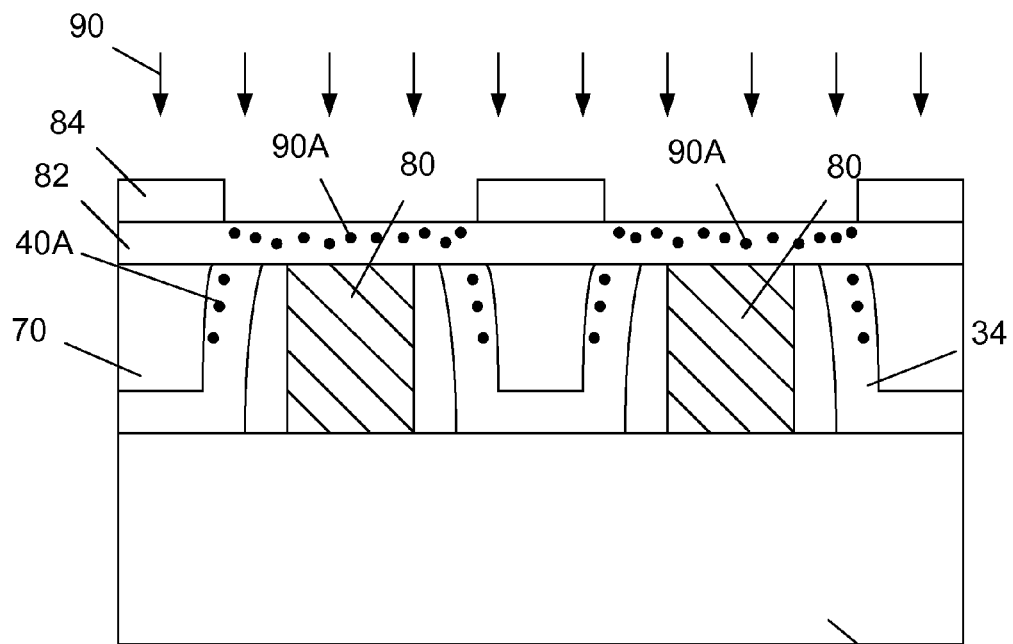

Next, as shown in FIG. 3F, a layer of hard mask material 82 is formed above the device 100 and the replacement gate structures 80. The layer of hard mask material 82 may comprised of a variety of different materials, e.g., silicon nitride, silicon dioxide, etc., its thickness may vary depending upon the particular application, e.g., less than 100 nm, and it may be formed by a variety of techniques, e.g., CVD, ALD, etc. In one illustrative embodiment, the layer of hard mask material 82 may be a layer of silicon nitride that has a thickness of about 30 nm that was formed by performing a CVD process. Also depicted in FIG. 3F is an illustrative patterned implant mask 84 that is patterned to expose portions of the layer of hard mask material 82 for further processing. In one illustrative embodiment, the patterned implant mask 84 is a patterned layer of photoresist material that was formed using traditional photolithography tools and techniques.

With continuing reference to FIG. 3F, an ion implant process 90 is performed through the patterned implant mask 84 to implant schematically depicted etch-inhibiting species 90A into portions of the layer of hard mask material 82. The species employed and parameters of the implant process 90 may be the same as those described previously for the implant process 16 or the implant process 40 (using a zero implant angle).

Figure 3G:
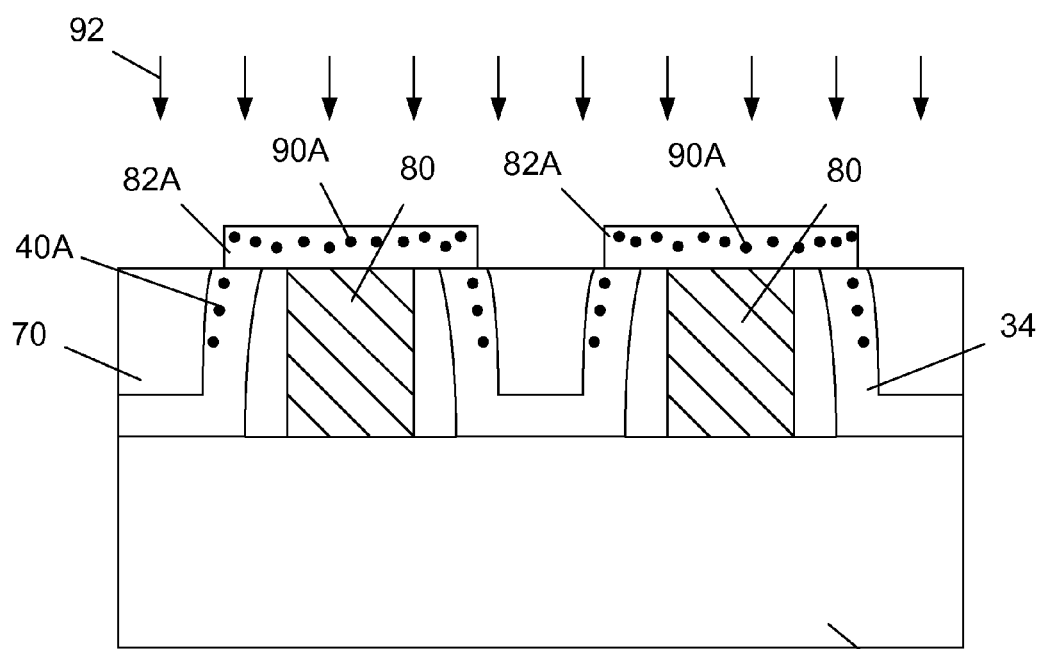

Next, as shown in FIG. 3G, the patterned implant mask 84 is removed and a wet or dry (plasma-based) etching process 92, e.g., a fluorine (F) based plasma etching process, may be performed on the entirety of the layer of hard mask material 82 to thereby define a patterned layer of hard mask material 82A. In one embodiment, the etching process 92 may be performed using the same parameters as discussed above with respect to the etching processes 18 or 60. As noted above, in the case where the etching process 92 is a dry plasma-based process, the etch-inhibiting species 90A in the implant regions of the hard mask layer 82 serve as seeding sites for forming polymer material (not shown), e.g., C—F polymer material, on the surface of the hard mask layer 82. As a result, the portions of the layer of hard mask material 82 that do not have the implanted etch-inhibiting species 90A may be readily removed during the etching process 92. In effect, the processes described herein result in the creation of an in situ patterned hard mask layer 82A in the sense that the patterned hard mask layer 82A is formed by exposing all of the layer of hard mask material 82 to the etching process 92. The statements above regarding the situation where the etching process 18 is a wet etching process apply equally to this situation where the etching process 92 is a wet etching process.

Figure 3H:
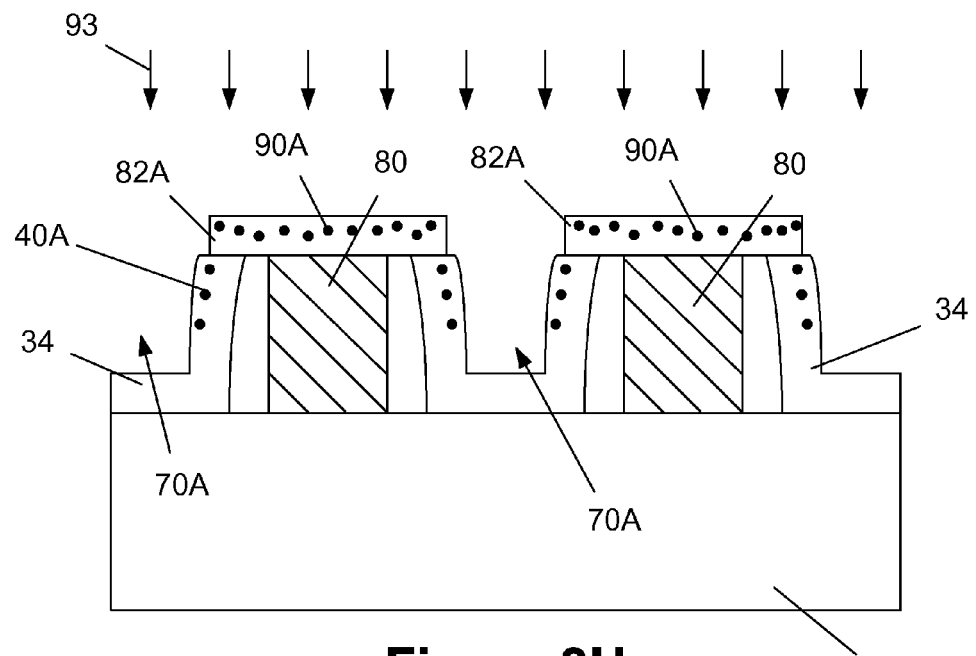
Figure 3I:
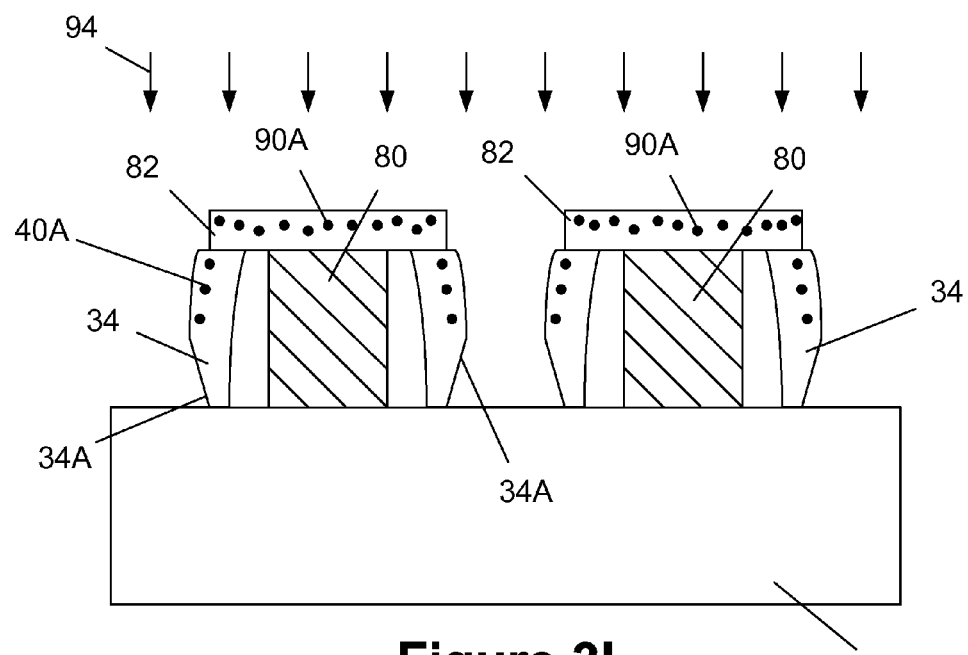
Figure 3J:
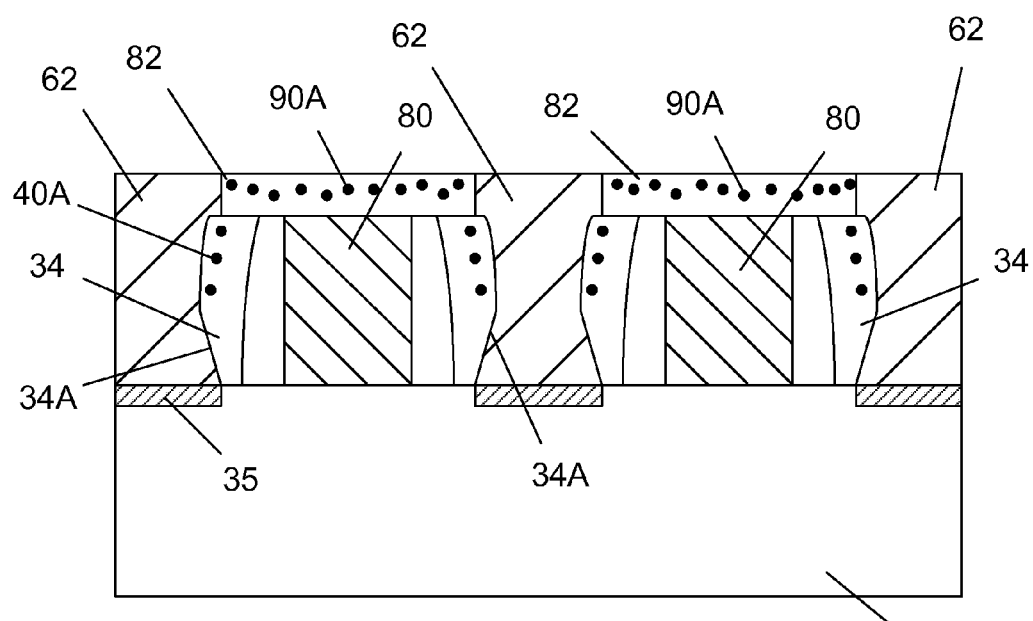

With reference to FIGS. 3H-3J, the next sequence of operations involves the formation of the conductive self-aligned contacts 62 and metal silicide regions 35 for the device 100. More specifically, in FIG. 3H, an etching process 93, e.g., a wet or dry etching process, may be performed on the layer of insulating material 70 through the patterned hard mask 82A. The etching process 93 is typically performed with an etch chemistry that is selective relative to the etch stop layer 34 and the patterned hard mask 82A. The etching process 93 results in the structure depicted in FIG. 3H wherein a plurality of trench-type or hole-type features 70A in the layer of insulating material 70 which exposes portions of the etch stop layer 34 for further processing.

Then, as shown in FIG. 3I, a wet or dry (plasma-based) etching process 94, e.g., a dry fluorine based plasma etching process, may be performed on the portions of the etch stop layer 34 that are exposed by the openings 70A. In one embodiment, the etching process 94 may be performed using the same parameters as discussed above with respect to the etching processes 18 or 60. The etching process 94 is typically performed with an etch chemistry that is selective relative to the substrate material. In the example depicted in FIG. 3I, the etching process 94 defines a plurality of trench-type or hole-type features 34A in the etch stop layer 34 that exposes portions of the source/drain regions (not shown) that are formed in the substrate 101. As discussed above with respect to the discussion of polymer formation, in the case where the etching process 94 is a dry plasma-based etching process, the implanted "etch-inhibiting" species 40A, 90A serve as seeding sites for forming polymer material (not shown), e.g., C—F polymer material, on the surface of the etch stop layer 34 and the patterned hard mask 82A where the implanted etch-inhibiting species 40A, 90A are located. As noted previously, once the surfaces of the etch stop layer 34 and the patterned hard mask layer 82A where the implanted etch-inhibiting species 40A, 90A are located are covered with the polymer material, the carbon (C) and fluorine (F) radicals in the plasma during the dry, plasma-based etching process 94 will perform both adsorption (deposition) or de-sorption (etching) dynamically. The presence of the polymer material effectively reduces the etch rate of those portions of the etch stop layer 34 and the patterned hard mask layer 82A where the polymer material is present. However, since the etch-inhibiting species 40A were not implanted into the lower regions of the etch stop layer 34, e.g., the region within the vertical dimension 44 shown in FIG. 2C, the portions of the etch stop layer 34 where such etch-inhibiting species 40A are not present will etch at a faster rate. Thus, the openings 34A may be formed in the lower portion of etch stop layer 34 while the polymer material formed on the portions of the etch stop layer 34 where the etch-inhibiting species 40A are present (and where the etch-inhibiting species 90A are present in the patterned hard mask layer 82) insures that the gate structure of the device will be protected during the contact formation process. The statements above regarding the situation where the etching process 18 is a wet etching process apply equally to this situation where the etching process 94 is a wet etching process.

In one illustrative embodiment, where the etching processes 92, 93, and 94 are all dry plasma-based etching process, they may be performed in a sequential manner (with some tuning of the process parameters, such as gas flows, process time, RF power, etc.) in a chamber without breaking the vacuum. In one particularly extreme example, the thickness of hard mask material 82 may be reduced to approximately zero, and the etch-inhibiting species can be implanted to the top surface of the replacement gate electrode, and the etching process 92 may be omitted. Then, during the etching processes 93 and 94, polymer material can still be formed on the top of replacement gate electrode as well as the upper portion of the spacer where the etch-inhibiting species are positioned. Such an etch mask that is defined by spaced-apart implant regions may be useful during the SAC formation process illustrated in FIG. 3F to 3I. Similarly, in case of all wet etching processes for etching processes 92, 93, and 94, they may be performed in a sequential manner (with some tuning of the process parameters, such as gas flows, process time, RF power, etc.) in a wet etching chamber without exposing the wafers to the ambient environment. Similarly, the thickness of hard mask material 82 may be reduced to approximately zero, and the etch-inhibiting species may be implanted to the top surface of the replacement gate electrode, and the wet etching process 92 may be omitted.

Next, as shown in FIG. 3J, metal silicide regions 35 are formed in the source/drain regions of the device 100 and a plurality of conductive self-aligned contacts 62 are formed in the openings 70A as previously described.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming sacrificial gate structures for first and second spaced-apart transistors above a semiconducting substrate;
    forming an etch stop layer above said substrate and said sacrificial gate structures for said transistors;
    performing at least one angled ion implant process to implant at least one etch-inhibiting species into less than an entirety of said etch stop layer;
    after performing said at least one angled ion implant process, forming a layer of insulating material above said etch stop layer;
    performing at least one chemical mechanical polishing process to expose at least a portion of each of said sacrificial gate structures;
    performing at least one first etching process to remove said sacrificial gate structures and thereby define a plurality of gate cavities;
    forming a replacement gate structure in each of said cavities;
    forming a hard mask layer above said replacement gate structures and said layer of insulating material;
    performing a second etching process on said hard mask layer to define a patterned hard mask layer, wherein an entire upper surface of said hard mask layer is exposed to said second etching process;
    performing at least one third etching process through said patterned hard mask layer to define an opening in said layer of insulating material and thereby expose a portion of said etch stop layer;
    performing a fourth etching process on said exposed portion of said etch stop layer to define a contact opening therethrough that exposes a doped region formed in said substrate; and
    forming a conductive contact in said opening that is conductively coupled to said doped region.

2. The method of claim 1, wherein performing said fourth etching comprises performing a wet etching process or a dry, plasma-based etching process.

3. The method of claim 1, wherein said etch-inhibiting species is a polymer-forming species and wherein performing said fourth etching process comprises performing a dry plasma-based etching process that causes formation of a polymer material proximate where said polymer-forming species have been implanted into said etch stop layer.

4. The method of claim 1, wherein performing said fourth etching process on said etch stop layer comprises performing a carbon-fluorine based plasma etching process on said etch stop layer.

5. The method of claim 1, wherein performing said fourth etching process comprises performing a plasma etching process using at least one of the following process gases: $C_4F_8$/$CH_2F_2$/Ar, $C_4F_6$/CO/Ar, $C_4F_6$, or $C_5F_8$ and nitrogen.

6. The method of claim 1, wherein performing said fourth etching process comprises performing a wet etching process that causes formation of a protective interfacial layer proximate where said at least one etch-inhibiting species have been implanted into said etch stop layer.

7. The method of claim 1, wherein said at least one angled implant process is performed at an angle such that said first transistor prevents the implantation of said at least one etch-inhibiting species into the entirety of the etch stop layer positioned proximate a side of said second transistor.

8. The method of claim 1, wherein said at least one angled implant process is performed at an angle such that a portion of said etch stop layer between said first and second transistors is not implanted with said etch-inhibiting species.

9. The method of claim 1, wherein said at least one angled implant process is performed at an angle such that portions of said etch stop layer within a vertical distance above a surface of said substrate that corresponds to approximately 30% of a gate height of one of said sacrificial gate structures is not implanted with said etch-inhibiting species.

10. The method of claim 9, wherein said vertical distance is about 40 nm or less.

11. The method of claim 1, wherein said at least one angled implant process is performed at an angle such that only portions of said etch stop layer that are positioned a vertical distance above a surface of said substrate that is greater than a distance that corresponds to approximately 30% of a gate height of one of said sacrificial gate structures is implanted with said etch-inhibiting species.

12. The method of claim 1, wherein said angled ion implant process is performed at an angle within the range of about 20-60 degrees relative to a vertical.

13. The method of claim 1, wherein forming said conductive contact comprises forming a conductive material in said opening and above said patterned hard mask layer.

14. A method, comprising:
    forming sacrificial gate structures for first and second spaced-apart transistors above a semiconducting substrate;
    forming an etch stop layer above said substrate and said sacrificial gate structures for said transistors;
    performing at least one angled ion implant process to implant at least one first etch-inhibiting species into less than an entirety of said etch stop layer;
    after performing said at least one angled ion implant process, forming a layer of insulating material above said etch stop layer;
    performing at least one chemical mechanical polishing process to expose at least a portion of each of said sacrificial gate structures;
    performing at least one first etching process to remove said sacrificial gate structures and thereby define a plurality of gate cavities;
    forming a replacement gate structure in each of said cavities;

forming a hard mask layer above said replacement gate structures and said layer of insulating material;

forming a patterned implant mask layer above said hard mask layer, said patterned implant mask layer exposing first portions of said hard mask layer and masking second portions of said hard mask layer;

performing at least one ion implant process through said patterned implant mask layer to selectively implant at least one second etch-inhibiting species into said first portions only of said hard mask layer;

after removing said implant mask layer, performing a second etching process on said hard mask layer to selectively remove said second portions only of said hard mask layer and thereby define a patterned hard mask layer;

performing at least one third etching process through said patterned hard mask layer to define an opening in said layer of insulating material and thereby expose a portion of said etch stop layer;

performing at least one fourth etching process on said exposed portion of said etch stop layer to define a contact opening therethrough that exposes a doped region formed in said substrate; and forming a conductive contact in said opening that is conductively coupled to said doped region.

15. The method of claim 14, wherein performing said second etching process and said fourth etching process comprises performing a wet etching process or a dry, plasma-based etching process.

16. The method of claim 14, wherein said first and second etch-inhibiting species are a polymer-forming species and wherein performing said second etching process and said fourth etching process comprises performing a dry, plasma-based etching process that causes formation of a polymer material proximate where said polymer-forming species have been implanted into said etch stop layer and said first portions of said hard mask layer, respectively.

17. The method of claim 14, wherein performing said second etching process and said fourth etching process comprises performing a carbon-fluorine based plasma etching process.

18. The method of claim 14, wherein performing said second etching process and said fourth etching process comprises performing a plasma etching process using at least one of the following process gases: $C_4F_8/CH_2F_2/Ar$, $C_4F_6/CO/Ar$, $C_4F_6$, or $C_5F_8$ and nitrogen.

19. The method of claim 14, wherein said first and second etch-inhibiting species are polymer-forming species and wherein performing said second etching process and said fourth etching process comprises performing a wet etching process that causes formation of a protective interfacial layer proximate where said first and second polymer-forming species have been implanted into said etch stop layer and said first portions of said hard mask layer, respectively.

20. The method of claim 14, wherein said at least one angled implant process is performed at an angle such that said first transistor prevents the implantation of said at least one first etch-inhibiting species into the entirety of the etch stop layer positioned proximate a side of said second transistor.

21. The method of claim 14, wherein said at least one angled implant process is performed at an angle such that a portion of said etch stop layer between said first and second transistors is not implanted with said first etch-inhibiting species.

22. The method of claim 14, wherein said at least one angled implant process is performed at an angle such that portions of said etch stop layer within a vertical distance above a surface of said substrate that corresponds to approximately 30% of a gate height of one of said sacrificial gate structures is not implanted with said first etch-inhibiting species.

23. The method of claim 22, wherein said vertical distance is about 40 nm or less.

24. The method of claim 14, wherein said at least one angled implant process is performed at an angle such that only portions of said etch stop layer that are positioned a vertical distance above a surface of said substrate that is greater than a distance that corresponds to approximately 30% of a gate height of one of said sacrificial gate structures is implanted with said first etch-inhibiting species.

25. The method of claim 14, wherein said angled ion implant process is performed at an angle within the range of about 20-60 degrees relative to a vertical.

26. A method, comprising:

forming sacrificial gate structures for first and second spaced-apart transistors above a semiconducting substrate;

forming an etch stop layer above said substrate and said sacrificial gate structures for said transistors;

performing at least one angled ion implant process to implant at least one polymer-forming species into less than an entirety of said etch stop layer;

after performing said at least one angled ion implant process, forming a layer of insulating material above said etch stop layer;

performing at least one chemical mechanical polishing process to expose at least a portion of each of said sacrificial gate structures;

performing at least one first etching process to remove said sacrificial gate structures and thereby define a plurality of gate cavities;

forming a replacement gate structure in each of said cavities;

forming a hard mask layer above said replacement gate structures and said layer of insulating material;

performing a second etching process on said hard mask layer to define a patterned hard mask layer, wherein an entire upper surface of said hard mask layer is exposed to said second etching process;

performing at least one third etching process through said patterned hard mask layer to define an opening in said layer of insulating material and thereby expose a portion of said etch stop layer;

performing a dry, plasma-based etching process on said exposed portion of said etch stop layer to define a contact opening therethrough that exposes a doped region formed in said substrate, wherein performing said dry, plasma-based etching process causes formation of a polymer material proximate where said polymer-forming species have been implanted into said etch stop layer; and forming a conductive contact in said opening that is conductively coupled to said doped region.

27. The method of claim 26, wherein performing said dry, plasma-based etching process on said etch stop layer comprises performing a carbon-fluorine based plasma etching process on said etch stop layer.

28. The method of claim 27, wherein performing said dry, plasma-based process comprises performing a dry plasma etching process using at least one of the following process gases: $C_4F_8/CH_2F_2/Ar$, $C_4F_6/CO/Ar$, $C_4F_6$, or $C_5F_8$ and nitrogen.

29. The method of claim 26, wherein said at least one angled implant process is performed at an angle such that said first transistor prevents the implantation of said at least one polymer-forming species into the entirety of the etch stop layer positioned proximate a side of said second transistor.

30. The method of claim 26, wherein said at least one angled implant process is performed at an angle such that a portion of said etch stop layer between said first and second transistors is not implanted with said polymer-forming species.

31. The method of claim 26, wherein said at least one angled implant process is performed at an angle such that portions of said etch stop layer within a vertical distance above a surface of said substrate that corresponds to approximately 30% of a gate height of one of said sacrificial gate structures is not implanted with said polymer-forming species.

32. The method of claim 31, wherein said vertical distance is about 40 nm or less.

33. The method of claim 26, wherein said at least one angled implant process is performed at an angle such that only portions of said etch stop layer that are positioned a vertical distance above a surface of said substrate that is greater than a distance that corresponds to approximately 30% of a gate height of one of said sacrificial gate structures is implanted with said polymer-forming species.

34. The method of claim 26, wherein forming said conductive contact comprises forming a conductive material in said opening and above said patterned hard mask layer.

35. A method, comprising:
    forming sacrificial gate structures for first and second spaced-apart transistors above a semiconducting substrate;
    forming an etch stop layer above said substrate and said sacrificial gate structures for said transistors;
    performing at least one angled ion implant process to implant at least one first polymer-forming species into less than an entirety of said etch stop layer;
    after performing said at least one angled ion implant process, forming a layer of insulating material above said etch stop layer;
    performing at least one chemical mechanical polishing process to expose at least a portion of each of said sacrificial gate structures;
    performing at least one first etching process to remove said sacrificial gate structures and thereby define a plurality of gate cavities;
    forming a replacement gate structure in each of said cavities;
    forming a hard mask layer above said replacement gate structures and said layer of insulating material;
    forming a patterned implant mask layer above said hard mask layer, said patterned implant mask layer exposing first portions of said hard mask layer and masking second portions of said hard mask layer;
    performing at least one ion implant process through said patterned implant mask layer to selectively implant at least one second polymer-forming species into said first portions only of said hard mask layer;
    after removing said implant mask layer, performing a first dry, plasma-based etching process on said hard mask layer to selectively remove said second portions only of said hard mask layer and thereby define a patterned hard mask layer, wherein performing said first dry, plasma-based etching process causes formation of a first polymer material proximate where said second polymer-forming species have been implanted into said first portions of said hard mask layer;
    performing at least one third etching process through said patterned hard mask layer to define an opening in said layer of insulating material and thereby expose a portion of said etch stop layer;
    performing a second dry, plasma-based etching process on said exposed portion of said etch stop layer to define a contact opening therethrough that exposes a doped region formed in said substrate, wherein performing said second dry, plasma-based etching process causes formation of a second polymer material proximate where said first polymer-forming species have been implanted into said etch stop layer; and
    forming a conductive contact in said opening that is conductively coupled to said doped region.

36. The method of claim 35, wherein performing said first and second dry, plasma-based etching processes comprises performing carbon-fluorine based plasma etching processes.

37. The method of claim 35, wherein performing said first and second dry, plasma-based etching processes comprises performing plasma etching processes using at least one of the following process gases: $C_4F_8/CH_2F_2/Ar$, $C_4F_6/CO/Ar$, $C_4F_6$, or $C_5F_8$ and nitrogen.

38. The method of claim 35, wherein said at least one angled implant process is performed at an angle such that said first transistor prevents the implantation of said at least one first polymer-forming species into the entirety of the etch stop layer positioned proximate a side of said second transistor.

39. The method of claim 35, wherein said at least one angled implant process is performed at an angle such that a portion of said etch stop layer between said first and second transistors is not implanted with said at least one first polymer-forming species.

40. The method of claim 35, wherein said at least one angled implant process is performed at an angle such that portions of said etch stop layer within a vertical distance above a surface of said substrate that corresponds to approximately 30% of a gate height of one of said sacrificial gate structures is not implanted with said at least one first polymer-forming species.

41. The method of claim 40, wherein said vertical distance is about 40 nm or less.

42. The method of claim 35, wherein said at least one angled implant process is performed at an angle such that only portions of said etch stop layer that are positioned a vertical distance above a surface of said substrate that is greater than a distance that corresponds to approximately 30% of a gate height of one of said sacrificial gate structures is implanted with said at least one first polymer-forming species.

* * * * *